US006906379B2

(12) United States Patent
Chen et al.

(10) Patent No.: US 6,906,379 B2
(45) Date of Patent: Jun. 14, 2005

(54) SEMICONDUCTOR MEMORY ARRAY OF FLOATING GATE MEMORY CELLS WITH BURIED FLOATING GATE

(75) Inventors: Bomy Chen, Cupertino, CA (US); Dana Lee, Santa Clara, CA (US); Hieu Van Tran, San Jose, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 10/653,015

(22) Filed: Aug. 28, 2003

(65) Prior Publication Data

US 2005/0045940 A1 Mar. 3, 2005

(51) Int. Cl.[7] .................. H01L 29/788; H01L 21/8238
(52) U.S. Cl. ...................... 257/315; 257/314; 257/316; 257/317; 257/318; 438/201; 438/211; 438/257
(58) Field of Search ................................ 257/314–315, 257/316–318, 321–322, 331; 438/201, 211, 257, 266

(56) References Cited

U.S. PATENT DOCUMENTS

| | | |
|---|---|---|
| 4,757,360 A | 7/1988 | Farone |
| 4,794,565 A | 12/1988 | Wu et al. |
| 4,882,707 A | 11/1989 | Mizutani |
| 4,905,062 A | 2/1990 | Esquivel et al. |
| 4,931,847 A | 6/1990 | Corda |
| 4,947,221 A | 8/1990 | Stewart et al. |
| 5,021,848 A | 6/1991 | Chiu |
| 5,029,130 A | 7/1991 | Yeh |
| 5,041,886 A | 8/1991 | Lee |
| 5,049,515 A | 9/1991 | Tzeng |
| 5,101,250 A | 3/1992 | Arima et al. |
| 5,268,319 A | 12/1993 | Harari |

(Continued)

FOREIGN PATENT DOCUMENTS

EP 0389721 10/1990

OTHER PUBLICATIONS

Hayashi, Fumihiko and Plummer, James D., "A Self-Aligned Split–Gate Flash EEPROM Cell With 3–D Pillar Structure", 1999 Symposium on VLSI Technology Digest of Technical Papers, Center for Integrated System, Stanford University, CA 94305, USA, pp. 87–88.
SZE, Simon, "Physics of Semiconductor Devices", 2nd Edition, Wiley–Interscience, Basic Device Characteristics pp. 438–439.
Brown, William D. et al.; "Nonvolatile Semiconductor Memory Technology, A Comprehensive Guide to Understanding And Using NVSM Devices", IEEE Press, pp. 33–34.
U.S. Appl. No. 10/358,601, filed Feb. 2003, Kianian.
U.S. Appl. No. 10/358,623, filed Feb. 2003, Hu et al.
U.S. Appl. No. 10/757,830, filed Jan. 2004, Yeh et al.
U.S. Appl. No. 10/105,741, filed Mar. 2002, Kianian.
U.S. Appl. No. 10/776,397, filed Feb. 2004, Kianian et al.
U.S. Appl. No. 10/776,483, filed Feb. 2004, Kianian et al.
U.S. Appl. No. 10/818,590, filed Apr. 2004, Kianian et al.

*Primary Examiner*—Donghee Kang
(74) *Attorney, Agent, or Firm*—Gray Cary Ware & Freidenrich LLP

(57) ABSTRACT

An array of floating gate memory cells, and a method of making same, where each pair of memory cells includes a pair of trenches formed into a surface of a semiconductor substrate, with a strip of the substrate disposed therebetween, a source region formed in the substrate strip, a pair of drain regions, a pair of channel regions each extending between the source region and one of the drain regions, a pair of floating gates each disposed in one of the trenches, and a pair of control gates. Each channel region has a first portion disposed in the substrate strip and extending along one of the trenches, a second portion extending underneath the one trench, a third portion extending along the one trench, and a fourth portion extending along the substrate surface and under one of the control gates.

36 Claims, 15 Drawing Sheets

U.S. PATENT DOCUMENTS

| | | |
|---|---|---|
| 5,338,953 A | 8/1994 | Wake |
| 5,381,028 A | 1/1995 | Iwasa |
| 5,429,965 A | 7/1995 | Shimoji |
| 5,495,441 A | 2/1996 | Hong |
| 5,544,103 A | 8/1996 | Lambertson |
| 5,572,054 A | 11/1996 | Wang et al. |
| 5,780,341 A | 7/1998 | Ogura |
| 5,780,892 A | 7/1998 | Chen |
| 5,789,293 A | 8/1998 | Cho et al. |
| 5,796,139 A | 8/1998 | Fukase |
| 5,808,328 A | 9/1998 | Nishizawa |
| 5,811,853 A | 9/1998 | Wang |
| 5,814,853 A | 9/1998 | Chen |
| 5,943,572 A | 8/1999 | Krautschneider |
| 6,091,104 A | 7/2000 | Chen |
| 6,103,573 A | 8/2000 | Harari et al. |
| 6,140,182 A | 10/2000 | Chen |
| 6,180,458 B1 | 1/2001 | Krautschneider et al. |
| 6,222,227 B1 | 4/2001 | Chen |
| 6,262,917 B1 | 7/2001 | Lee |
| 6,316,298 B1 | 11/2001 | Lee |
| 6,316,315 B1 | 11/2001 | Hofmann et al. |
| 6,521,944 B1 | 2/2003 | Mirgorodski |
| 6,525,371 B2 | 2/2003 | Johnson et al. |
| 6,538,275 B2 | 3/2003 | Sugiyama et al. |
| 6,541,815 B1 | 4/2003 | Mandelman et al. |
| 6,756,633 B2 | 6/2004 | Wang et al. |
| 2003/0073275 A1 | 4/2003 | Kianian et al. |

SEMICONDUCTOR MEMORY ARRAY OF FLOATING GATE MEMORY CELLS WITH BURIED FLOATING GATE

TECHNICAL FIELD

The present invention relates to a self-aligned method of forming a semiconductor memory array of floating gate memory cells. The present invention also relates to a semiconductor memory array of floating gate memory cells of the foregoing type.

BACKGROUND OF THE INVENTION

Non-volatile semiconductor memory cells using a floating gate to store charges thereon and memory arrays of such non-volatile memory cells formed in a semiconductor substrate are well known in the art. Typically, such floating gate memory cells have been of the split gate type, or stacked gate type.

One of the problems facing the manufacturability of semiconductor floating gate memory cell arrays has been the alignment of the various components such as source, drain, control gate, and floating gate. As the design rule of integration of semiconductor processing decreases, reducing the smallest lithographic feature, the need for precise alignment becomes more critical. Alignment of various parts also determines the yield of the manufacturing of the semiconductor products.

Self-alignment is well known in the art. Self-alignment refers to the act of processing one or more steps involving one or more materials such that the features are automatically aligned with respect to one another in that step processing. Accordingly, the present invention uses the technique of self-alignment to achieve the manufacturing of a semiconductor memory array of the floating gate memory cell type.

There is a constant need to shrink the size of the memory cell arrays in order to maximize the number of memory cells on a single wafer. It is well known that forming memory cells in pairs, with each pair sharing a single source region, and with adjacent pairs of cells sharing a common drain region, reduces the size of the memory cell array. However, a large area of the array is typically reserved for the bit-line connection to the drain regions.

The bit-line area is often occupied by the contact openings between memory cell pairs, and the contact to wordline spacing, which strongly depends upon lithography generation, contact alignment and contact integrity. In addition, significant space is reserved for the word-line transistor, the size of which is set by lithography generation and junction scaling.

Traditionally, floating gates are formed with a sharp edge facing a control gate to enhance Fowler-Nordheim tunneling, which is used to move electrons off of the floating gate during an erase operation. The sharp edge is typically formed by oxidizing or partially etching the top surface of the floating gate poly in an uneven manner. However, as the dimensions of the floating gate get smaller, this sharp edge can be more difficult to form in this manner.

There is also a need to improve the programming efficiency of memory cell array. In conventional programming schemes, the electrons in the channel region flow in a path parallel to the floating gate, where a relatively small number of the heated electrons are injected onto the floating gate. The estimated program efficiency (number of electrons injected compared to total number of electrons) is estimated at about $1/1000$.

It is known to form memory cell elements over non-planar portions of the substrate. For example, U.S. Pat. No. 5,780,341 (Ogura) discloses a number of memory device configurations that includes a step channel formed in the substrate surface. While the purpose of the step channel is to inject hot electrons more efficiently onto the floating gate, these memory device designs are still deficient in that it is difficult to optimize the size and formation of the memory cell elements as well the necessary operational parameters needed for efficient and reliable operation.

There is a need for a non-volatile, floating gate type memory cell array with significant cell size reduction while providing enhanced programming efficiency.

SUMMARY OF THE INVENTION

The present invention solves the above-mentioned problems by providing a self-aligned method of forming memory cells with reduced size and novel structure, and a memory cell array formed thereby.

The present invention is an electrically programmable and erasable memory device that includes a substrate of semiconductor material having a first conductivity type and a surface, a pair of trenches formed into the substrate surface, wherein a strip of the substrate is disposed between the pair of trenches, a first region of a second conductivity type formed in the substrate strip, a pair of second regions of the second conductivity type formed in the substrate and spaced apart from the first region, a pair of channel regions each extending from the first region to one of the second regions and each having a first portion extending underneath one of the trenches, a second portion not disposed in the substrate strip and extending along the one trench, and a third portion extending along the substrate surface, a pair of electrically conductive floating gates each having at least a lower portion thereof disposed in one of the trenches, and a pair of electrically conductive control gates each disposed over and insulated from one of the channel region third portions.

In another aspect of the present invention, an array of electrically programmable and erasable memory devices includes a substrate of semiconductor material having a first conductivity type and a surface, spaced apart isolation regions of the substrate which are substantially parallel to one another and extend in a first direction, with an active region between each pair of adjacent isolation regions, and each of the active regions includes a plurality of pairs of memory cells. Each of the memory cell pairs includes a pair of trenches formed into the substrate surface, wherein a strip of the substrate is disposed between the pair of trenches, a first region of a second conductivity type formed in the substrate strip, a pair of second regions of the second conductivity type formed in the substrate and spaced apart from the first region, a pair of channel regions each extending from the first region to one of the second regions and each having a first portion extending underneath one of the trenches, a second portion not disposed in the substrate strip and extending along the one trench, and a third portion extending along the substrate surface, a pair of electrically conductive floating gates each having at least a lower portion thereof disposed in one of the trenches, and a pair of electrically conductive control gates each disposed over and insulated from one of the channel region third portions.

In yet another aspect of the present invention, a method of forming a semiconductor memory cell includes forming a pair of trenches into a surface of a semiconductor substrate of a first conductivity type, wherein a strip of the substrate is disposed between the pair of trenches, forming a first region of a second conductivity type in the substrate strip, forming a pair of second regions of the second conductivity type in the substrate and spaced apart from the first region, wherein a pair of channel regions each extend from the first region to one of the second regions and each have a first portion extending underneath one of the trenches, a second portion not disposed in the substrate strip and extending along the one trench, and a third portion extending along the substrate surface, forming a pair of electrically conductive floating gates each having at least a lower portion thereof disposed in one of the trenches, and forming a pair of electrically conductive control gates each disposed over and insulated from one of the channel region third portions.

In still yet another aspect of the present invention, an electrically programmable and erasable memory device includes a substrate of semiconductor material having a first conductivity type and a surface, a first trench formed into the substrate surface, a second trench formed into the substrate surface that is spaced apart from the first trench by a portion of the substrate, a first region of a second conductivity type formed in the substrate adjacent the first trench and not in the substrate portion, a second region of the second conductivity type formed in the substrate adjacent the second trench and not in the substrate portion, a channel region of the substrate extending between the first and second regions, wherein the channel region includes a first portion extending from the first region and along the first trench, a second portion extending underneath the first trench, a third portion disposed in the substrate portion and extending along the first trench, a fourth portion disposed in the substrate portion and extending along the substrate surface, a fifth portion disposed in the substrate portion and extending along the second trench, a sixth portion extending underneath the second trench, and a seventh portion extending from the second region and along the second trench, a pair of electrically conductive floating gates each having at least a lower portion thereof disposed in one of the first and second trenches, and an electrically conductive control gate disposed over and insulated from the channel region fourth portion.

Other objects and features of the present invention will become apparent by a review of the specification, claims and appended figures.

DETAILED DESCRIPTION OF THE PREFERRED EMBODIMENTS

The method of the present invention is illustrated in FIGS. 1A to 1F and 2A to 2P, which show the processing steps in making the memory cell array of the present invention. The method begins with a semiconductor substrate 10, which is preferably of P type and is well known in the art. The thicknesses of the layers described below will depend upon the design rules and the process technology generation. What is described herein is for a 0.1 $\mu$m process. However, it will be understood by those skilled in the art that the present invention is not limited to any specific process technology generation, nor to any specific value in any of the process parameters described hereinafter.

Isolation Region Formation

Figure 1A:
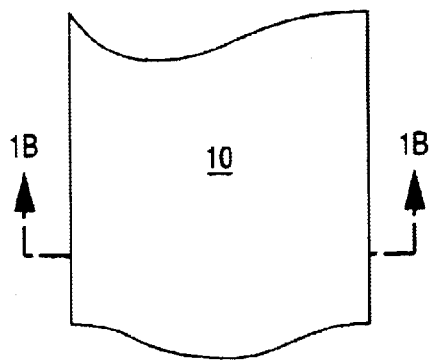
FIG. 1A is a top view of a semiconductor substrate used in the first step of the method of present invention to form isolation regions.
Figure 1B:
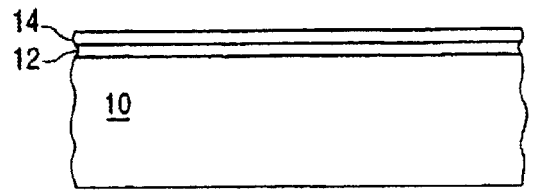
FIG. 1B is a cross sectional view of the structure taken along the line 1B—1B showing the initial processing steps of the present invention.

FIGS. 1A to 1F illustrate the well known STI method of forming isolation regions on a substrate. Referring to FIG. 1A there is shown a top plan view of a semiconductor substrate 10 (or a semiconductor well), which is preferably of P type and is well known in the art. First and second layers of material 12 and 14 are formed (e.g. grown or deposited) on the substrate. For example, first layer 12 can be silicon dioxide (hereinafter "oxide"), which is formed on the substrate 10 by any well known technique such as oxidation or oxide deposition (e.g. chemical vapor deposition or CVD) to a thickness of approximately 50–150 Å. Nitrogen doped oxide or other insulation dielectrics can also be used. Second layer 14 can be silicon nitride (hereinafter "nitride"), which is formed over oxide layer 12 preferably by CVD or PECVD to a thickness of approximately 1000–5000 Å. FIG. 1B illustrates a cross-section of the resulting structure.

Figure 1C:
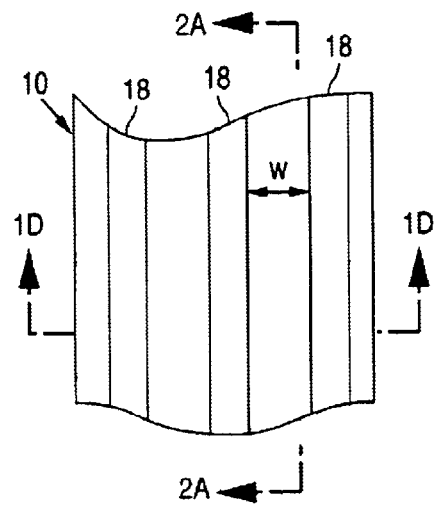
FIG. 1C is a top view of the structure showing the next step in the processing of the structure of FIG. 1B, in which isolation regions are defined.
Figure 1D:
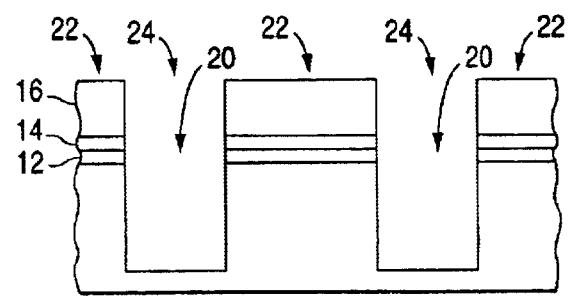
FIG. 1D is a cross sectional view of the structure in FIG. 1C taken along the line 1D—1D showing the isolation trenches formed in the structure.

Once the first and second layers 12/14 have been formed, suitable photo resist material 16 is applied on the nitride layer 14 and a masking step is performed to selectively remove the photo resist material from certain regions (stripes 18) that extend in the Y or column direction, as shown in FIG. 1C. Where the photo-resist material 16 is removed, the exposed nitride layer 14 and oxide layer 12 are etched away in stripes 18 using standard etching techniques (i.e. anisotropic nitride and oxide/dielectric etch processes) to form trenches 20 in the structure. The distance W between adjacent stripes 18 can be as small as the smallest lithographic feature of the process used. A silicon etch process is then used to extend trenches 20 down into the silicon substrate 10 (e.g. to a depth of approximately 500 Å to several microns), as shown in FIG. 1D. Where the photo resist 16 is not removed, the nitride layer 14 and oxide layer 12 are maintained. The resulting structure illustrated in FIG. 1D now defines active regions 22 interlaced with isolation regions 24.

Figure 1E:
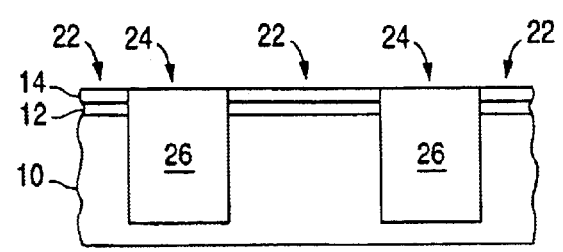
FIG. 1E is a cross sectional view of the structure in FIG. 1D showing the formation of isolation blocks of material in the isolation trenches.

The structure is further processed to remove the remaining photo resist 16. Then, an isolation material such as silicon dioxide is formed in trenches 20 by depositing a thick oxide layer, followed by a Chemical-Mechanical-Polishing (CMP) etch (using nitride layer 14 as an etch stop) to remove the oxide layer except for oxide blocks 26 in trenches 20, as shown in FIG. 1E. The remaining nitride and oxide layers 14/12 are then removed using nitride/oxide etch processes, leaving STI oxide blocks 26 extending along isolation regions 24, as shown in FIG. 1F.

The STI isolation method described above is the preferred method of forming isolation regions 24. However, the well known LOCOS isolation method (e.g. recessed LOCOS, poly buffered LOCOS, etc.) could alternately be used, where the trenches 20 may not extend into the substrate, and isolation material may be formed on the substrate surface in stripe regions 18. FIGS. 1A to 1F illustrate the memory cell array region of the substrate, in which columns of memory cells will be formed in the active regions 22 which are separated by the isolation regions 24.

Memory Cell Formation

Figure 1F:
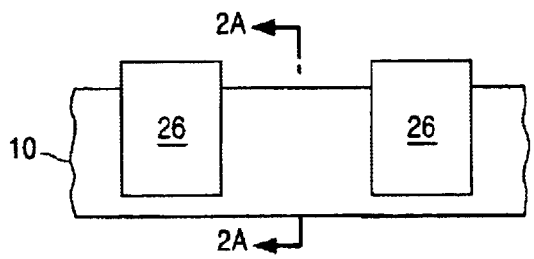
FIG. 1F is a cross sectional view of the structure in FIG. 1E showing the final structure of the isolation regions.
Figure 2A:
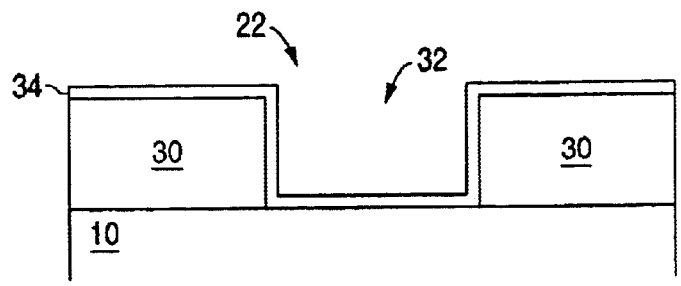
FIGS. 2A–2P are cross sectional views of the semiconductor structure in FIG. 1F taken along the line 2A—2A showing in sequence the steps in the processing of the semiconductor structure in the formation of a non-volatile memory array of floating gate memory cells of the present invention.
Figure 2B:
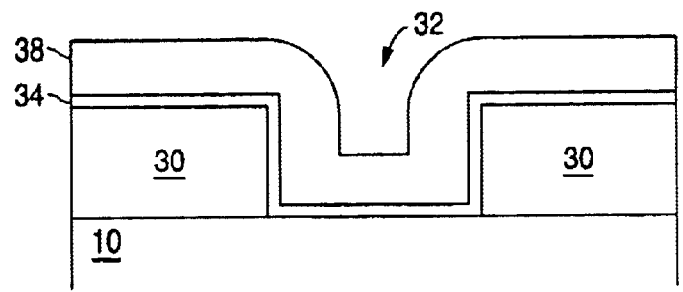
Figure 2C:
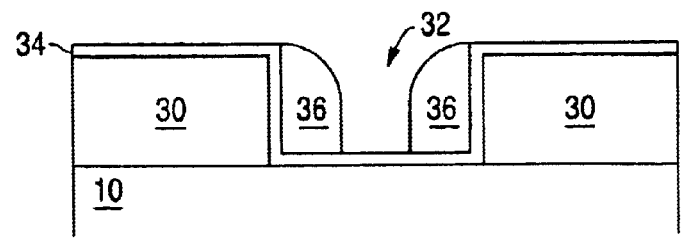

The structure shown in FIG. 1F is further processed as follows. FIGS. 2A to 2P show the cross sections of the structure in the active regions 22 from a view orthogonal to that of FIG. 1F (along line 2A—2A as shown in FIGS. 1C and 1F), as the next steps in the process of the present invention are performed.

A thick layer of hard mask material 30 (e.g. nitride) is formed over the substrate 10 (e.g. ~3500 Å thick). A plurality of parallel second trenches 32 are formed in the nitride layer 30 via conventional lithography (e.g. by applying a photo resist masking material on the nitride layer 30, by performing a masking step to remove the photo resist material from selected parallel stripe regions, and by performing an anisotropic nitride etch to remove the exposed portions of nitride layer 30 in the stripe regions, leaving second trenches 32 that extend down to and expose substrate 10). After the photo resist is removed, a thin layer 34 of insulation material (e.g. oxide) is formed over the structure, including over the nitride layer 30, along sidewalls of second trenches 32, and along the exposed portions of substrate 10. The resulting structure is shown in FIG. 2A.

Nitride spacers 36 are next formed along the sidewalls of the second trenches 32. Formation of spacers is well known in the art, and involves the deposition of a material over the contour of a structure, followed by an anisotropic etch process, whereby the material is removed from horizontal surfaces of the structure, while the material remains largely intact on vertically oriented surfaces of the structure (with a rounded upper surface). Spacers 36 are formed by depositing nitride 38 over the structure (e.g. approximately 300 to 1000 Å thickness) as shown in FIG. 2B, followed by an anisotropic nitride etch that removes nitride 38 except for nitride spacers 36 in second trenches 32, as illustrated in FIG. 2C.

Figure 2D:
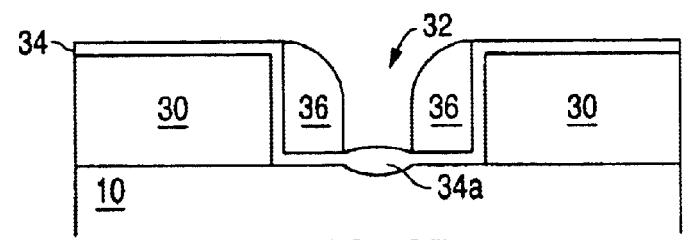
Figure 2E:
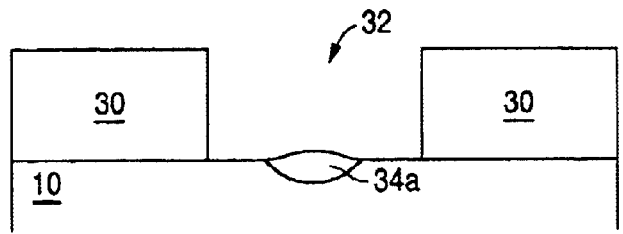

A local oxidation process is performed next, which thickens portions 34a of oxide layer 34 left exposed between nitride spacers 36 (in the center of second trenches 32), as shown in FIG. 2D. A nitride etch is then used to remove nitride spacers 36, followed by a controlled (e.g. wet) oxide etch that removes oxide layer 34, but leaves oxide portions 34a largely intact. As shown in FIG. 2E, those portions of substrate 10 underneath second trenches 32 are left exposed, except for those portions at the center of the second trenches 32, which are covered by oxide portions 34a.

Figure 2F:
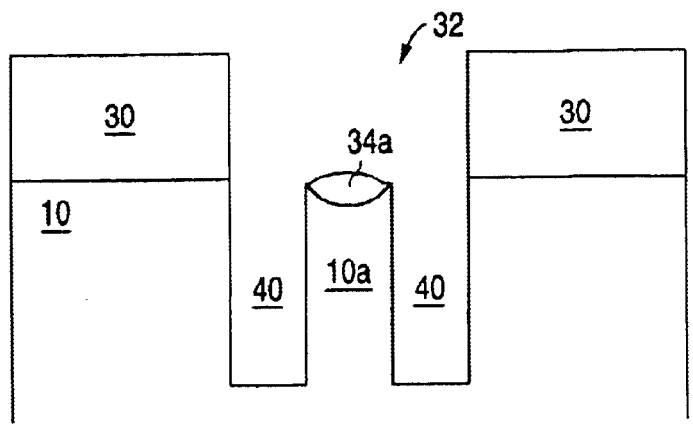
Figure 2G:
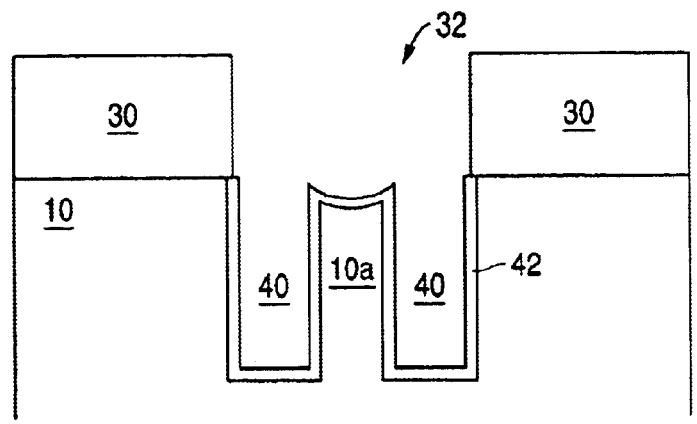

An anisotropic silicon etch is then performed to form (third) trenches 40 into the exposed portions of substrate 10. As shown in FIG. 2F, a pair of the third trenches 40 are formed in each second trench 32, with a strip 10a of the substrate 10 (protected from the silicon etch by oxide 34a) left (laterally) separating each pair of the third trenches 40. It should be noted that each third trench 40 extends across one of the active regions 22 and between adjacent STI oxide blocks 26, and does not extend across the isolation regions 24. The oxide 34a is then removed using a wet oxide etch, (however some of oxide 34a can be optionally left intact if desired). A thermal oxidation step is then performed to form a layer 42 of oxide along the bottom and side walls of third trenches 40, as well as on the substrate strip 10a disposed between third trenches 40. The resulting structure is illustrated in FIG. 2G.

Figure 2H:
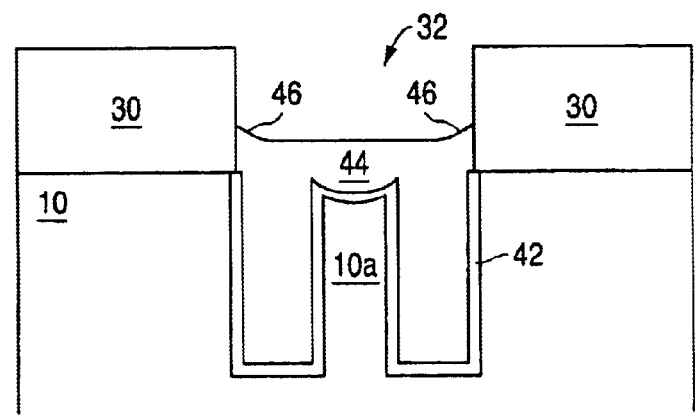

A thick layer of polysilicon 44 (hereinafter "poly") is then formed over the structure, which fills second trenches 32, including third trenches 40. Poly layer 44 can be doped (e.g. n+) by ion implant, or by an in-situ doped poly process. An optional CMP etch can be used to planarize the top surface of poly layer 44. Then, a controlled poly etch is performed to recess the top surface of poly layer 44 down below the top surface of nitride layer 30, where the top surface of poly layer 44 is disposed above the surface of the substrate 10, but even or below the tops of STI oxide blocks 26 in the isolation regions 24 (i.e. so poly layer 44 is fully removed from the isolation regions 24). This can be accomplished, for example, by using STI oxide blocks 26 as the etch stop for this controlled poly etch. The poly etch may also form sloped portions 46 on the poly layer top surface adjacent nitride 30. The resulting structure is shown in FIG. 2H.

Figure 2I:
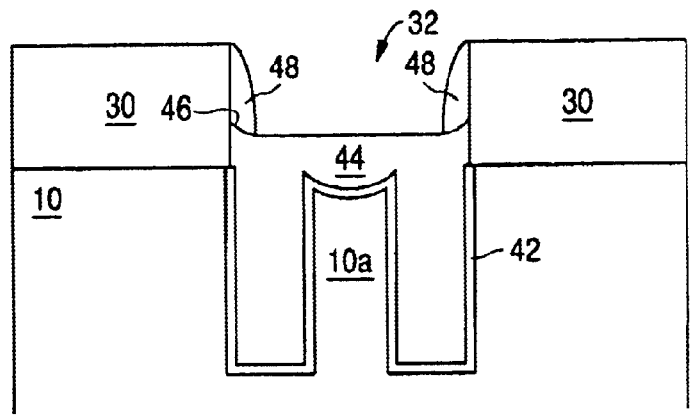
Figure 2J:
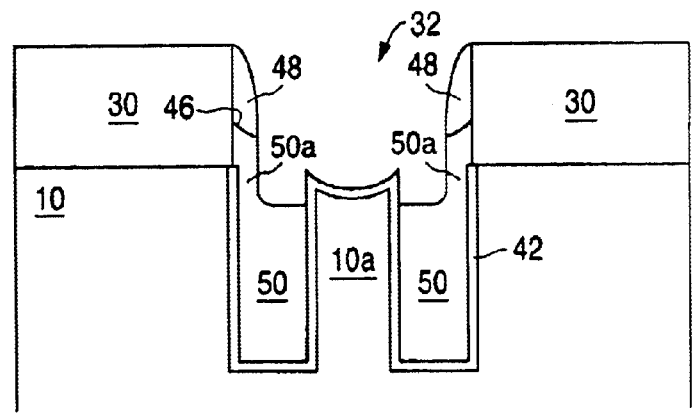

Optional nitride spacers 48 can be formed over sloped portions 46 of poly layer 44 by depositing nitride over the structure, followed by an anisotropic nitride etch, leaving nitride spacers 48 disposed over portions of poly layer 44, as shown in FIG. 2I. Another controlled poly etch is then performed to etch down the exposed upper portions of poly layer 44, including removing those portions of poly layer 44 disposed over substrate strip 10a separating adjacent pairs of third trenches 40, as illustrated in FIG. 2J. This poly etch leaves separate poly blocks 50, each disposed in one of the third trenches 40. Each poly block 50 includes a narrow upper portion 50a that extends up and out of one of the third trenches 40 (and above the surface of substrate 10).

Figure 2K:
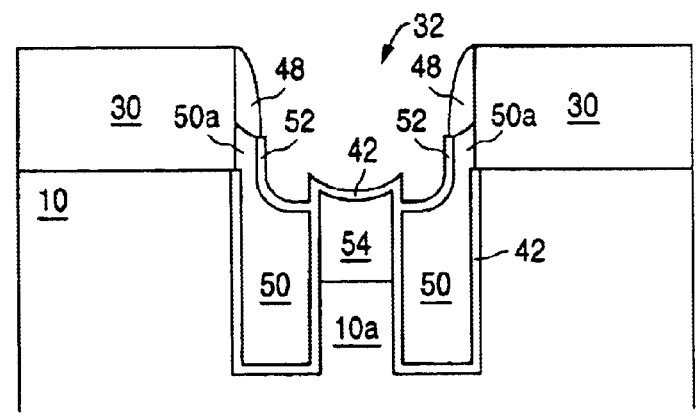

A thermal oxidation process is next used to oxidize the exposed surfaces poly blocks 50, forming oxide layer 52 thereon. This oxidation step may also thicken the exposed portions of oxide layer 42 over substrate strips 10a. Suitable ion implantation that, depending upon if the substrate is P or N type, may include arsenic, phosphorous, boron and/or antimony (and possible anneal) is then made across the surface of the structure to form first (source) regions 54 in the exposed substrate strips 10a in second trenches 32. The source regions 54 are self-aligned to the oxide strips 10a by third trenches 40, and have a second conductivity type (e.g. N type) that is different from a first conductivity type of the substrate strips 10a (e.g. P type). The ions have no significant effect on the remaining structure. The resulting structure is shown in FIG. 2K. It should be noted that this ion implantation could be performed before the oxidation of poly blocks 50, or after the formation of the nitride spacers described next.

Figure 2L:
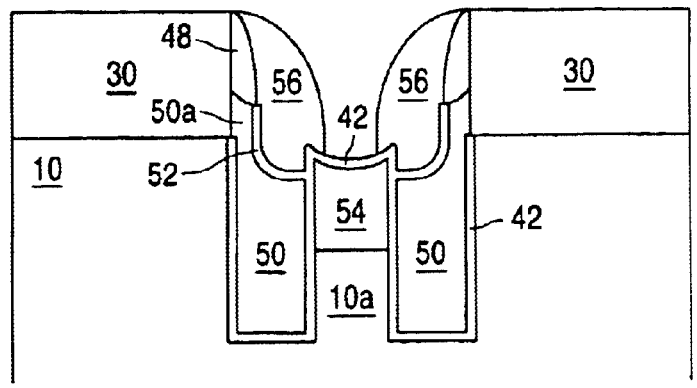
Figure 2M:
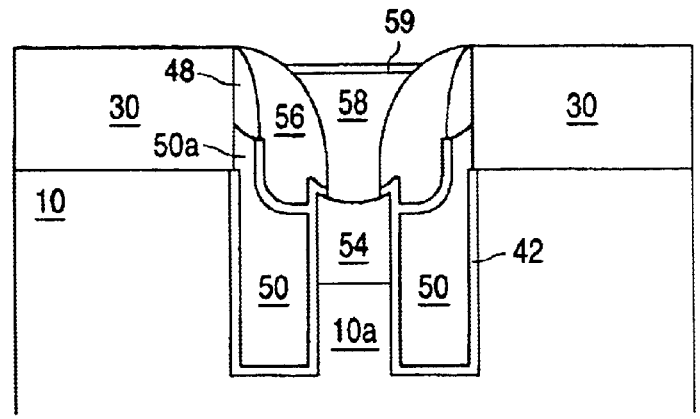

Oxide spacers 56 are next formed in second trenches 32 and over poly blocks 50 by an oxide deposition (e.g. HTO oxide deposition) and anisotropic oxide etch, as illustrated in FIG. 2L. For each second trench 32, this oxide etch also removes the exposed portion of oxide layer 42 disposed over source region 54 and between oxide spacers 56 (at the center of second trench 32), exposing at least a portion of the source region 54. A poly deposition step, followed by a poly CMP etch (using the nitride layer 30 as an etch stop) are next used to fill second trenches 32 with poly blocks 58 (which are in electrical contact with source regions 54). An optional controlled poly etch can be used to recess the tops of poly blocks 58 below the tops of oxide spacers 56. An optional metalized polysilicon (polycide) layer 59 can be formed on poly blocks 58 by depositing a metal such as tungsten, cobalt, titanium, nickel, platinum, or molybdenum over the poly blocks 58, and then annealing the structure to permit the metal to react with the exposed surfaces of poly blocks 58 to form metalized polysilicon. The resulting structure is shown in FIG. 2M.

Figure 2N:
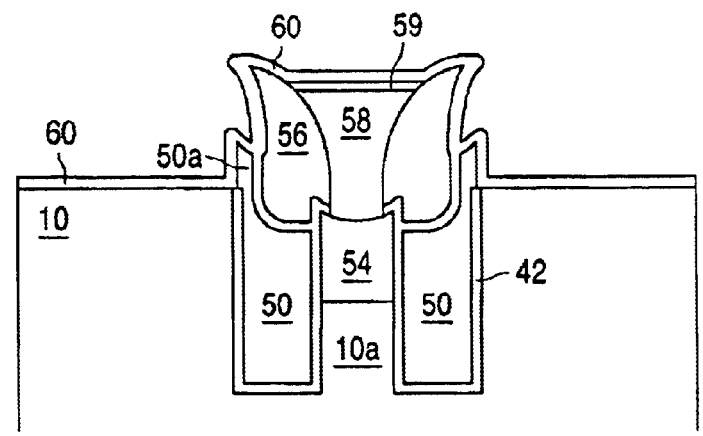

A nitride etch (e.g. wet nitride etch) follows, which removes nitride layer 30 and nitride spacers 48, and which exposes poly block upper portions 50a A tunnel oxide layer 60 is next formed on the structure (e.g. by oxide deposition). Oxide layer 60 extends over the exposed portions of substrate 10, poly block upper portions 50a, oxide spacers 56, and poly blocks 58, as illustrated in FIG. 2N.

Figure 2O:
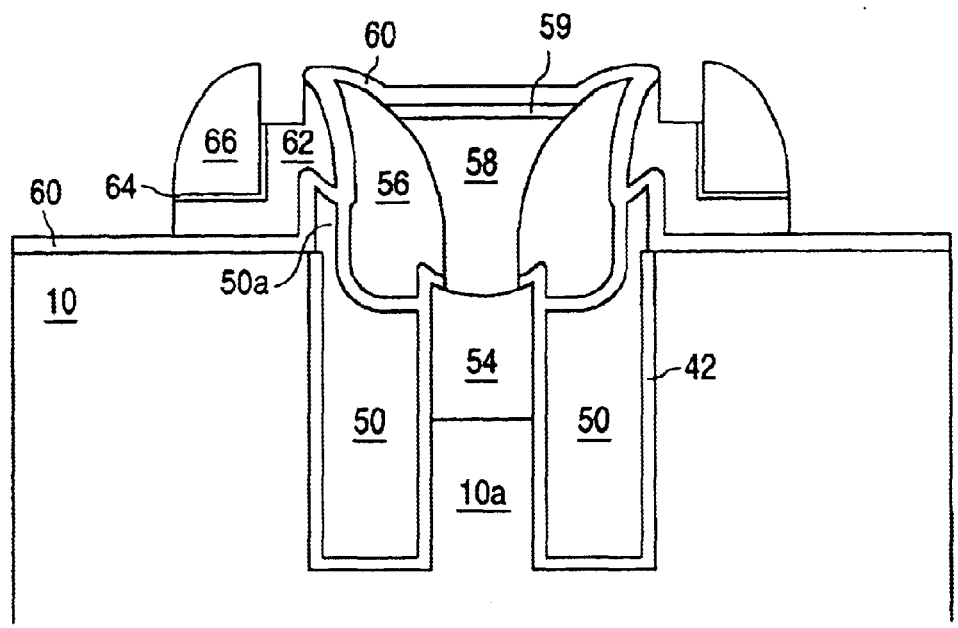
Figure 2P:
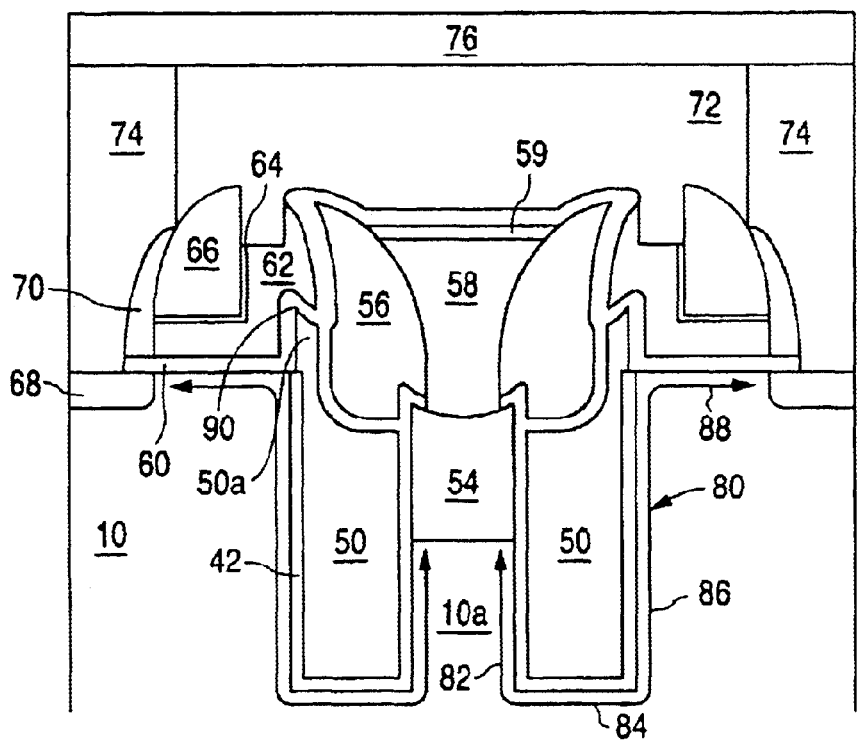

A poly deposition step is used to form a poly layer 62 over the structure (e.g. approximately 500 Å thick). An optional polycide deposition or metal deposition and anneal process can be performed to form a layer of polycide 64 on poly layer 62. Nitride spacers 66 are then formed over and adjacent poly layer 62 (and polycide 64) by a nitride deposition and anisotropic etch. A poly anisotropic etch is next performed to remove the exposed portions of poly layer 62 and polycide 64 (i.e. those portions not protected by nitride spacers 66), as shown in FIG. 2O. This poly etch preferably recesses the upper portions of poly layer 62 below the top portions of spacers 66.

Suitable ion implantation (and anneal) is used to form second (drain) regions 68 in the substrate 10 (adjacent spacers 66). Oxide spacers 70 are formed over substrate 10 and adjacent nitride spacers 66 by oxide deposition and anisotropic etch, which also removes exposed portions of oxide layer 60. An optional ion implantation (and anneal) can be performed after oxide spacers 70 have been formed so that the drain regions 68 are graded. Insulation material 72, such as BPSG or oxide, is then formed over the entire structure. A masking step is performed to define etching areas over the drain regions 68. The insulation material 72 is selectively etched in the masked regions to create contact openings that extend down to and expose drain regions 68. The contact openings are then filled with a conductor metal (e.g. tungsten) to form metal contacts 74 that are electrically connected to drain regions 68. Metal drain line contacts 76 (e.g. aluminum, copper, etc.) are added by metal masking over the insulation material 72, to connect together all the contacts 74 (and thus all the drain regions 68) in each active region 22. The final active region memory cell structure is illustrated in FIG. 2P.

As shown in FIG. 2P, the process of the present invention forms pairs of memory cells that mirror each other, with a memory cell formed on each side of the poly block 58. For each memory cell, first and second regions 54/68 form the source and drain regions respectively (although those skilled in the art know that source and drain can be switched during operation). Poly block 50 constitutes the floating gate, and poly layer 62 constitutes the control gate. Channel region 80 for each memory cell is defined in the surface portion of the substrate that is in-between the source and drain 54/68. Each channel region 80 includes four portions joined together at approximate right angles, with a first (generally vertical) portion 82 extending down from the source region 54 along the vertical wall of floating gate 50 (in filled second trench 32), a second (generally horizontal) portion 84 extending underneath floating gate 50, a third (generally vertical) portion 86 extending up from second portion 84 along the other vertical wall of floating gate 50, and a fourth (generally horizontal) portion 88 extending between the floating gate 50 and the drain region 68. Each pair of memory cells share a common source region 54 that extends down between the pair's floating gates 50 and is in electrical contact with poly block 58. Similarly, each drain region 68 is shared between adjacent memory cells from different mirror sets of memory cells.

Figure 3:
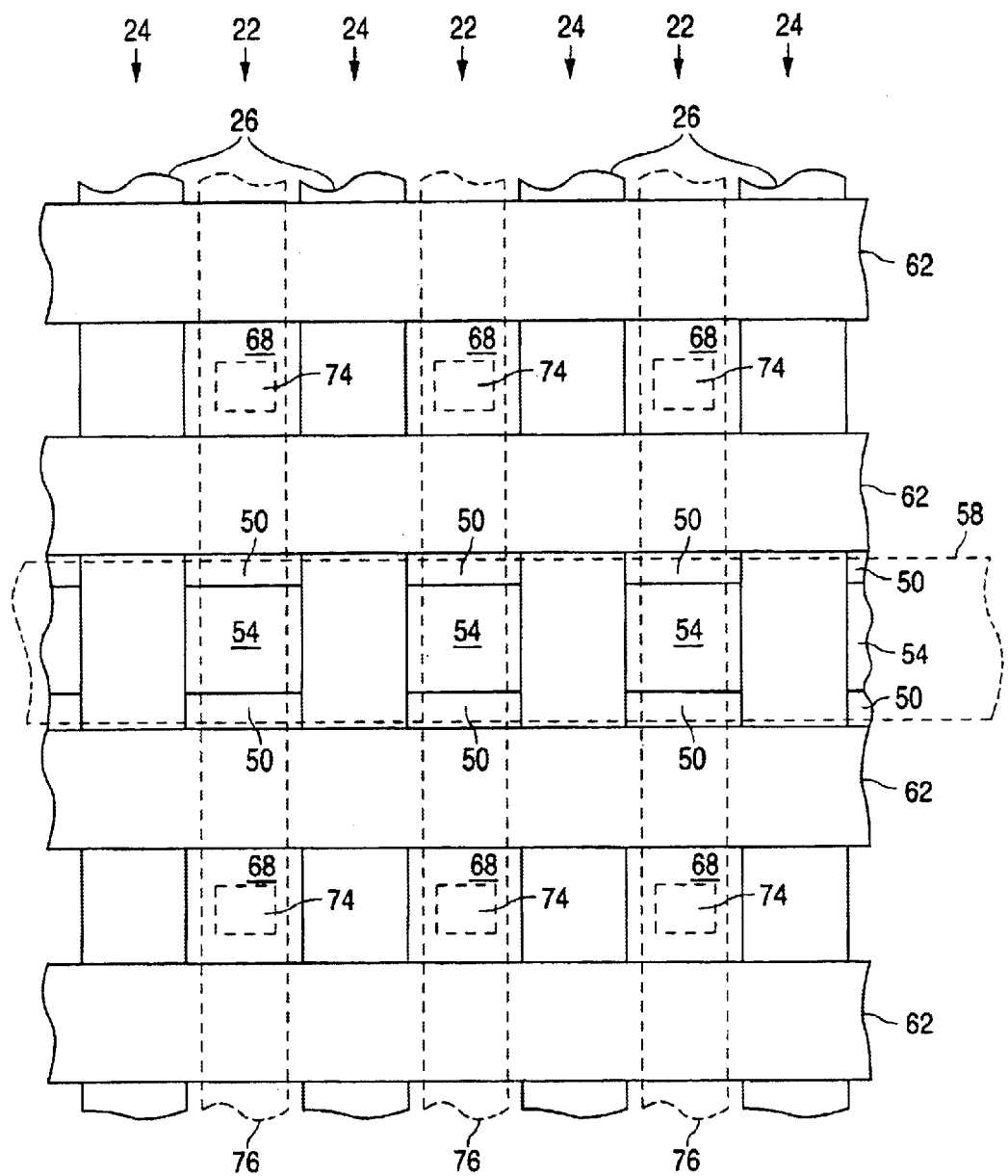
FIG. 3 is a top plan view of the memory cell array of the present invention.

FIG. 3 is a top view of the resulting structure showing the interconnection between bit lines 76 and drain regions 68, as well as control gates 62 which are continuously formed as control (word) lines that extend across both the active and isolation regions 22/24. The above-described process does not produce source regions 54 that extend across the isolation regions 24 (which can easily be done by a deep implant, or by removing the STI insulation material from the isolation region portions of second trenches 32 before ion implantation). However, poly blocks 58 (which are in electrical contact with source regions 54) are formed continuously across the isolation regions to adjacent active regions, and form source lines each of which electrically connects together all the source regions 54 for each row of paired memory cells.

The floating gates 50 are disposed in second trenches 32, and extend deeper into the substrate 10 (from the substrate surface) that do source regions 54, so that for each memory cell pair, a portion of the substrate (10a) is (laterally) bounded on either side by floating gates 50 and disposed underneath source region 54. Each floating gate 50 faces and is insulated from channel portions 82/84/86, the source region 54 and poly layer 62. Each floating gate 50 includes an upper portion 50a that extends above the substrate surface and terminates in an edge 90 that faces and is insulated from one of the control gates 62, thus providing a path for Fowler-Nordheim tunneling through oxide layer 60. Source region 54 is disposed laterally adjacent to (and insulated from) floating gates 50, for enhanced voltage coupling therebetween.

Memory Cell Operation

The operation of the memory cells will now be described. The operation and theory of operation of such memory cells are also described in U.S. Pat. No. 5,572,054, whose disclosure is incorporated herein by reference with regard to the operation and theory of operation of a non-volatile memory cell having a floating gate and a control gate, floating gate to control gate tunneling, and an array of memory cells formed thereby.

To initially erase a selected memory cell in any given active region 22, a ground potential is applied to both its source 54 and drain 68. A high-positive voltage (e.g. +7 to +15 volts) is applied to the control gate 62. Electrons on the floating gate 50 are induced through the Fowler-Nordheim tunneling mechanism to tunnel from the upper portion 50a of the floating gate 50 (primarily from edge 90), through the oxide layer 60, and onto the control gate 62, leaving the floating gate 50 positively charged. Tunneling is enhanced by the sharpness of edge 90. It should be noted that since each of the control gates 62 extends across the active and isolation regions as continuous control (word) lines, one memory cell in each active region is 'erased' at the same time.

When a selected memory cell is desired to be programmed, a small voltage (e.g. 0.5 to 1.0 V) is applied to its drain region 68. A positive voltage level in the vicinity of the threshold voltage of the MOS structure (on the order of approximately +0.8 to 2 volts) is applied to its control gate 62. A positive high voltage (e.g. on the order of 5 to 12 volts) is applied to its source region 54. Electrons generated by the drain region 68 will flow from the drain region 68 towards the source region 54 through the deeply depleted horizontal portion 88 of the channel region 80. As the electrons reach the vertical portion 86 of the channel region 80, they will see the high potential of floating gate 50 (because the floating gate 50 is strongly voltage-coupled to the positively charged source region 54. The electrons will accelerate and become heated, with most of them being injected into and through the insulating layer 42 and onto the floating gate 50. Low or ground potential is applied to the source/drain regions 54/68 and control gates 62 for memory cell rows/columns not containing the selected memory cell. Thus, only the memory cell in the selected row and column is programmed.

The injection of electrons onto the floating gate 50 will continue until the reduction of the charge on the floating gate 50 can no longer sustain a high surface potential along the vertical channel region portion 86 to generate hot electrons. At that point, the electrons or the negative charges in the floating gate 50 will decrease the electron flow from the drain region 68 onto the floating gate 50.

Finally, to read a selected memory cell, ground potential is applied to its source region 54. A read voltage (e.g. −0.5 to 2 volts) is applied to its drain region 68 and approximately 1 to 4 volts (depending upon the power supply voltage of the device) is applied to its control gate 62. If the floating gate 50 is positively charged (i.e. the floating gate is discharged of electrons), then the channel region portions 82/84/86 (directly adjacent to the floating gate 50) are turned on. When the control gate 62 is raised to the read potential, the horizontal channel region portion 88 (directly adjacent the control gate 62) is also turned on. Thus, the entire channel region 80 will be turned on, causing electrons to flow from the source region 54 to the drain region 68. This sensed electrical current would be the "1" state.

On the other hand, if the floating gate 50 is negatively charged, the channel region portions 82/84/86 are either weakly turned on or is entirely shut off. Even when the control gate 62 and the drain region 68 are raised to the read potential, little or no current will flow through channel region portions 82/84/86. In this case, either the current through the channel region 80 is very small compared to that of the "1" state or there is no current at all. In this manner, the memory cell is sensed to be programmed at the "0" state. Ground potential is applied to the source/drain regions 54/68 and control gates 62 for non-selected columns and rows so only the selected memory cell is read.

The memory cell array includes peripheral circuitry including conventional row address decoding circuitry, column address decoding circuitry, sense amplifier circuitry, output buffer circuitry and input buffer circuitry, which are well known in the art and not described in any further detail herein.

The present invention provides a memory cell array with reduced size and superior program efficiency. Memory cell size is reduced significantly because the source regions 54 are self-aligned to the third trenches 40 (in which the floating gates 50 are formed), where space is not wasted due to limitations in the lithography generation, contact alignment and contact integrity. Each floating gate 50 has a lower portion disposed in third trench 40 formed in the substrate for receiving the tunneling electrons during the program operation and for turning on the generally vertical and horizontal channel region portions 82/84/86 during the read operation. Each floating gate 50 also has an upper portion that extends out of the second trench formed in the substrate and terminates in an edge facing the control gate for Fowler Nordheim tunneling thereto during the erase operation.

Program efficiency is greatly enhanced by "aiming" the horizontal portion 88 of the channel region 80 at the floating gate 50. In conventional programming schemes, the electrons in the channel region flow in a path parallel to the floating gate, where a relatively small number of the heated electrons are injected onto the floating gate. The estimated program efficiency (number of electrons injected compared to total number of electrons) in such conventional programming schemes is estimated at about $1/1000$. However, because the horizontal portion of the channel region defines an electron path that is 'aimed' directly at the floating gate, the program efficiency of the present invention is improved by 10 fold or even 100 fold, where almost all the electrons are injected onto the floating gate.

Also with the present invention, there is also an enhanced voltage coupling between each floating gate 50 and the corresponding source region 54 due to the lateral proximity of these memory cell components. At the same time, there is relatively low voltage coupling between the floating gate 50 and the control gate 62. Long vertical spacer etches are avoided since spacers are not formed in third trenches 40, and trench width is not limited by thin-film depositions. The portion of oxide layer 42 disposed between the floating gate 50 and the source 54 acts as both a voltage and thermal coupling dielectric. By having the source region 54 laterally disposed between the floating gates 50, with the floating gates extending deeper into the substrate than does the source region 54, there is less drain induced barrier lowering (DIBL) influence of Vss junction on the word line (i.e. the floating gate acts as a shield because it is physically interposed between the source and drain—there is no direct path between source and drain to compete with the gated channel region).

FIRST ALTERNATE EMBODIMENT

Figure 4:
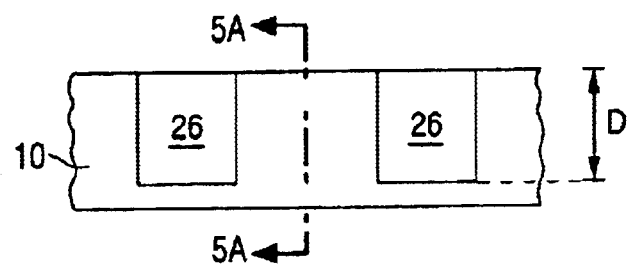
FIG. 4 is a cross sectional view showing the formation of the isolation regions for a first alternate embodiment of the present invention.
Figure 5A:
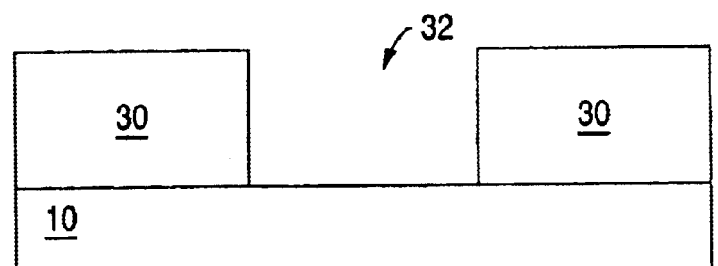
FIGS. 5A–5R are cross sectional views of the semiconductor structure in FIG. 4 taken along the line 5A—5A showing in sequence the steps in the first alternate processing embodiment of the semiconductor structure of the present invention.
Figure 5B:
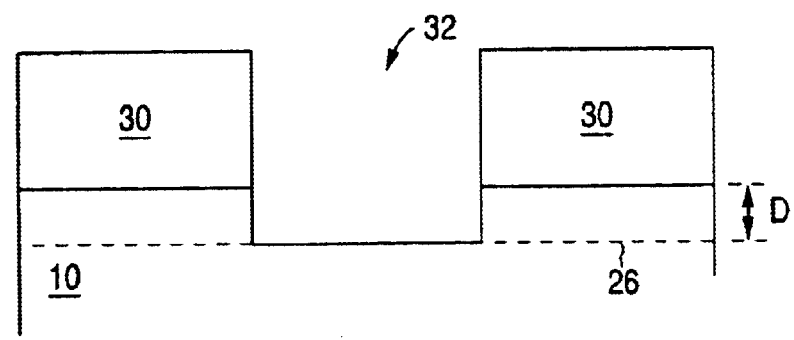
Figure 5C:
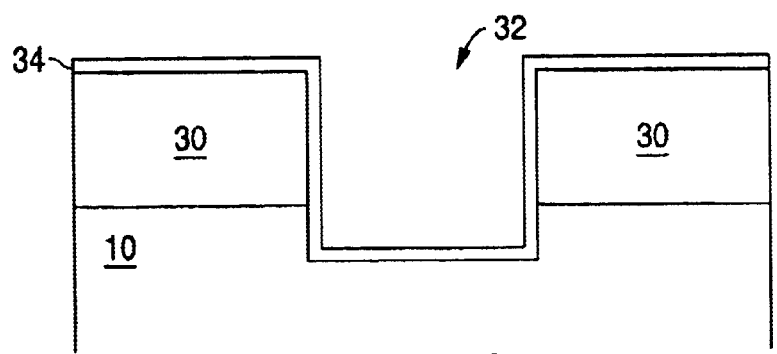
Figure 5D:
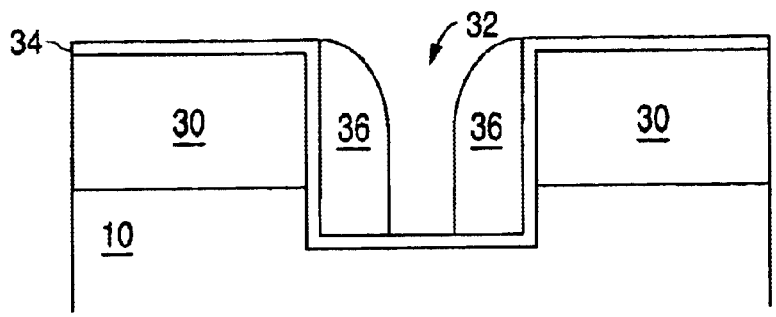
Figure 5E:
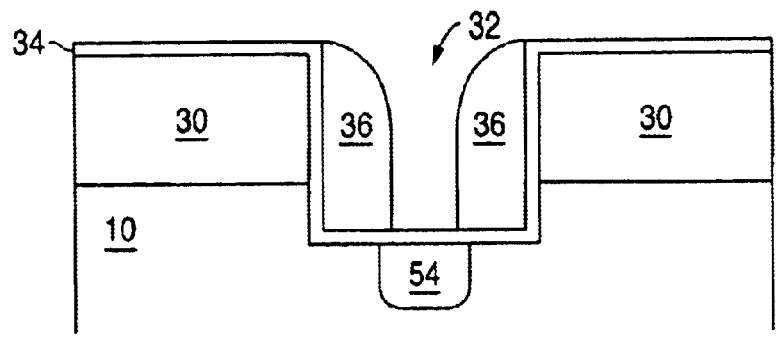
Figure 5F:
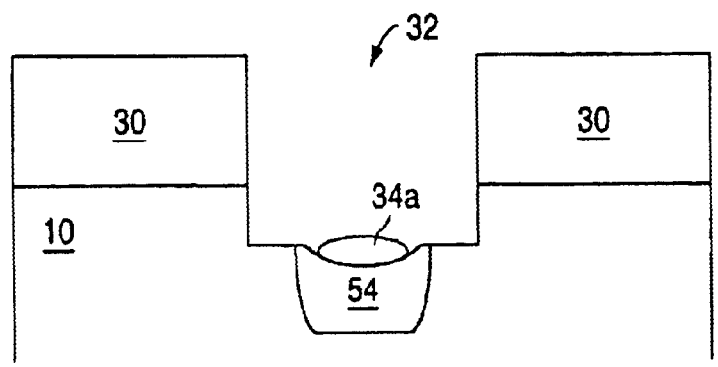
Figure 5G:
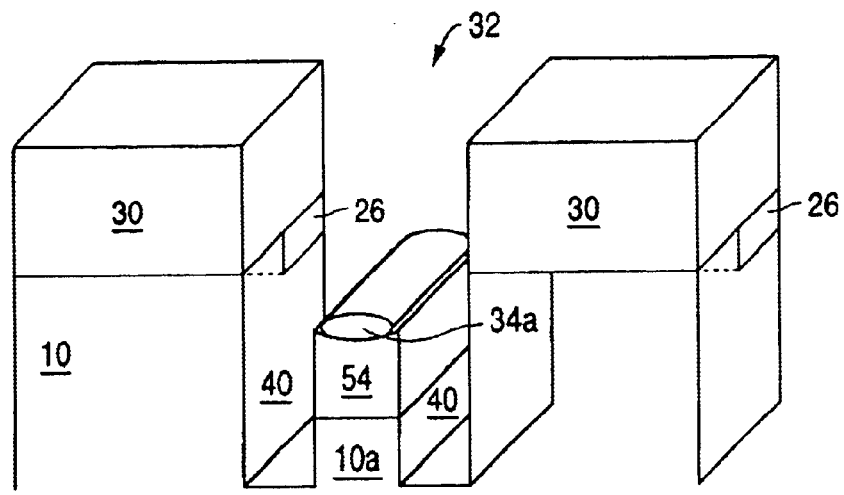
Figure 5H:
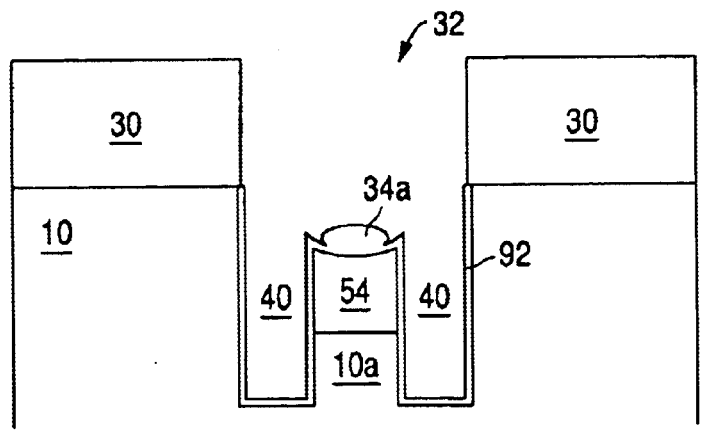
Figure 5I:
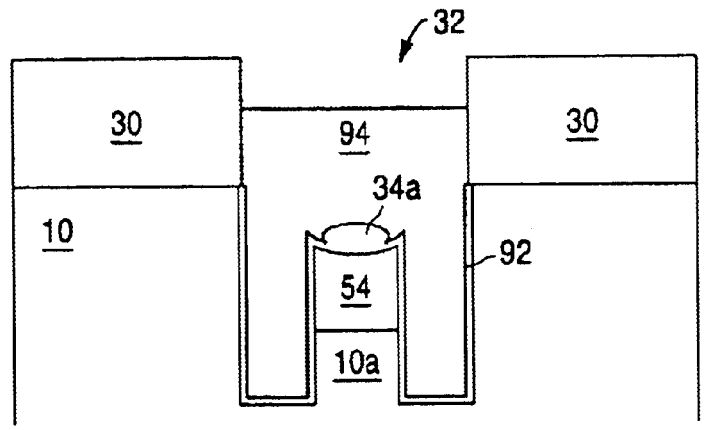
Figure 5J:
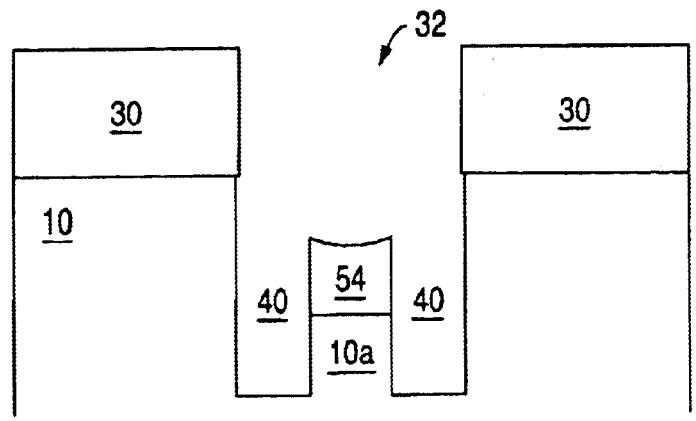
Figure 5K:
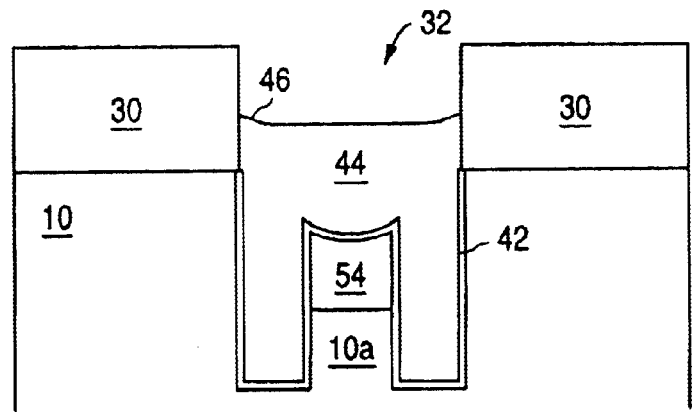
Figure 5L:
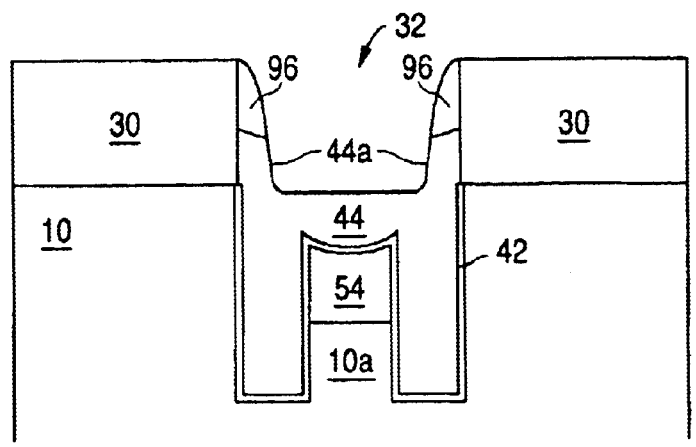
Figure 5M:
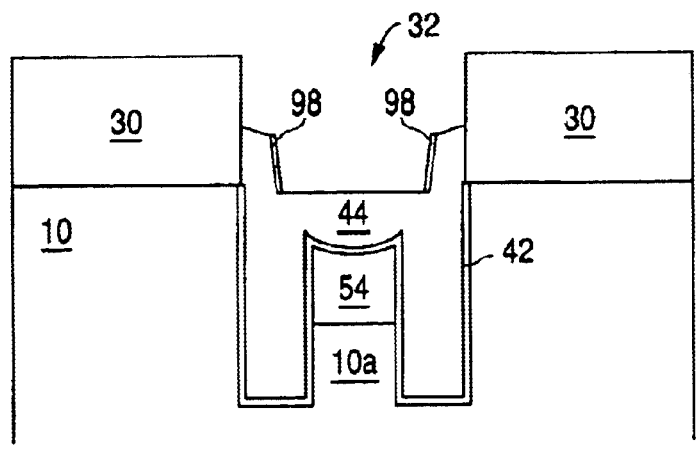
Figure 5N:
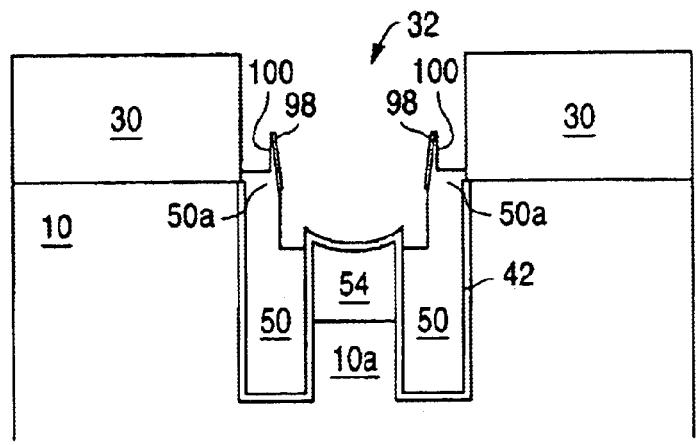
Figure 5O:
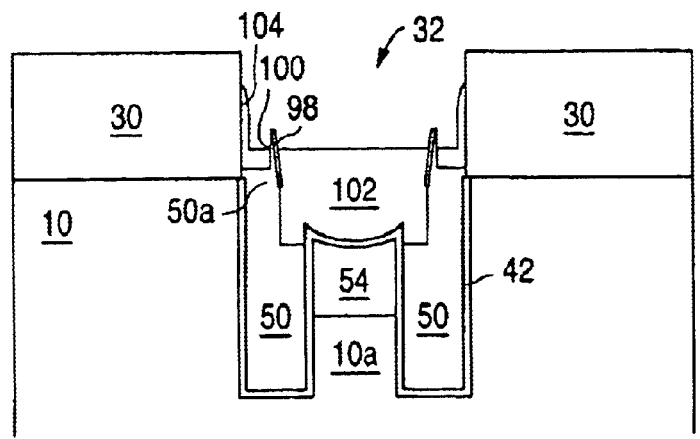
Figure 5P:
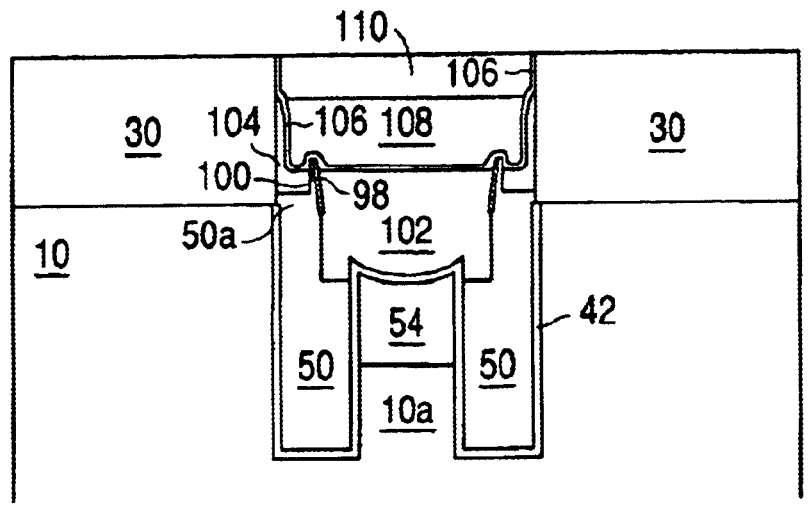
Figure 5Q:
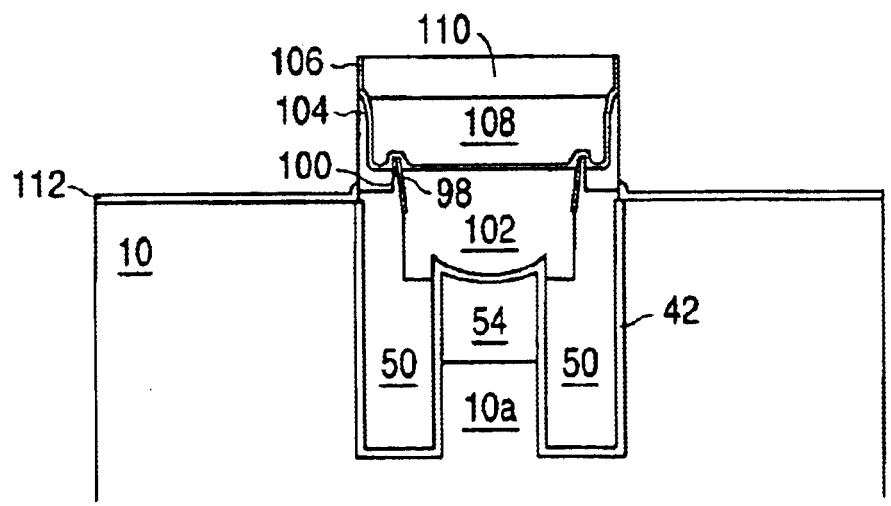
Figure 5R:
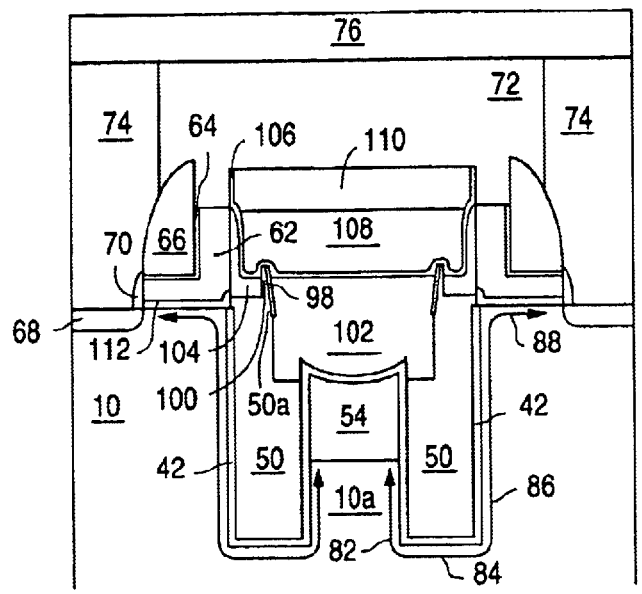

FIGS. 4 and 5A to 5R illustrate an alternate embodiment of the present invention, which includes forming an erase gate for each pair of memory cells. The method begins with the structure shown in FIG. 1F, except that the upper surface of STI blocks 26 are even with the surface of the substrate 10, as illustrated in FIG. 4. This can be accomplished by omitting layers 12 and 14 in the formation of STI blocks 26, resulting in the structure shown in FIG. 4.

The structure shown in FIG. 4 is further processed as follows, with FIGS. 5A to 5R showing the cross sections of the structure in the active regions 22 from a view orthogonal to that of FIG. 4 (along line 5A—5A). Many of the processing steps and/or structures disclosed below are similar to or the same as processing steps and/or structures described above with respect to FIGS. 2A–2P, and therefore in such instances the same reference numerals will be used for brevity.

The thick nitride hard mask layer 30 is formed over the substrate 10 (e.g. ~3500 Å thick), followed by the formation of the second trenches 32 in the nitride layer 30 via conventional lithography, as shown in FIG. 5A, which exposes portions of substrate 10. A silicon etch is then performed to extend second trenches 32 down into substrate 10, preferably down to the same depth D as STI blocks 26 (shown in phantom) in the isolation regions 24, as shown in FIG. 5B. An anisotropic oxide etch is then used to remove from the isolation regions 24 the exposed portions of the STI blocks 26 in second trenches 32, so that second trenches 32 extend across the active and isolation regions 22/24 with a generally uniform depth.

The thin oxide layer 34 is formed over the structure, including over the nitride layer 30, along sidewalls of second trenches 32, and along the exposed portions of substrate 10, as illustrated in FIG. 5C. Nitride spacers 36 are next formed along the sidewalls of the second trenches 32 by nitride deposition and anisotropic etch, as illustrated in FIG. 5D. Suitable ion implantation is then made across the surface of the structure to form the first (source) regions 54 in the substrate portions exposed at the bottom of second trenches 32 and between nitride spacers 36, as shown FIG. 5E. The source regions 54 each extend under one of the second trenches 32 and across the active and isolation regions 22/24.

An oxidation process is performed next, which thickens portions 34a of oxide layer 34 left exposed between nitride spacers 36 (in the center of second trenches 32). A nitride etch is then used to remove nitride spacers 36, followed by a controlled (e.g. wet) oxide etch that removes oxide layer 34, but leaves oxide portions 34a largely intact. As shown in FIG. 5F, those portions of substrate 10 underneath second trenches 32 are left exposed, except for those portions at the center of the second trenches 32, which are covered by oxide portions 34a. Ideally, source regions 54 are wider than the oxide portions 34a.

An anisotropic silicon etch is then performed to form the (third) trenches 40 into the exposed portions of substrate 10, with a pair of the third trenches 40 formed in each second trench 32, and strip 10a of the substrate 10 (protected from the silicon etch by oxide 34a) left separating each pair of the third trenches 40. It should be noted that each third trench 40 extends across the active and isolation regions 22/24, as illustrated in FIG. 5G. A thermal oxidation step is then performed to form a sacrificial layer 92 of oxide along the bottom and side walls of third trenches 40, as well as thickening the oxide portion 34a over substrate strip 10a, as shown in FIG. 5H.

Second trenches 32 are now filled with insulation material 94 (e.g. oxide) via oxide deposition and etch back processes. Preferably, a CMP oxide etch is used to planarize the deposited oxide, and then a controlled etch is used to recess the oxide 94 below the tops of nitride 30, as illustrated in FIG. 5I. Masking material is then formed over the structure, and removed from just the active regions 22 (leaving isolation regions 24 covered). An anisotropic oxide etch is then used to remove the oxide 94 from the active regions 22 (leaving oxide 94 intact in the isolation regions 24). This oxide etch also removes oxide layers 92 and 34a from the active regions 22. The resulting structure in the active regions is shown in FIG. 5J. Those portions of trenches 32 and 40 in the isolation regions 24 remained filled with oxide 94.

A thermal oxidation step is then performed to form the layer 42 of oxide along the bottom and side walls of third trenches 40, as well as on the substrate strip 10a disposed between third trenches 40. Poly layer 44 is next formed over the structure, which fills second trenches 32, including third trenches 40. As stated above, poly layer 44 can be doped (e.g. n+) by ion implant, or by an in-situ doped poly process. An optional CMP etch can be used to planarize the top surface of poly layer 44. Then, a controlled poly etch is performed to recess the top surface of poly layer 44 down below the top surface of nitride layer 30, where the top surface of poly layer 44 is disposed above the surface of the substrate 10, but even or below the top of oxide layer 94 in the isolation regions 24 (i.e. so poly layer 44 is fully removed from the isolation regions 24). This can be accomplished, for example, by using oxide layer 94 as the etch stop for this controlled poly etch. The poly etch may also form sloped portions 46 on the poly layer top surface adjacent nitride 30. The resulting structure is shown in FIG. 5K.

Oxide spacers 96 are formed over sloped portions 46 of poly layer 44 by depositing oxide over the structure, followed by an anisotropic oxide etch. A controlled poly etch is then performed to etch down the exposed upper center portions of poly layer 44, creating steeply sloped portions 44a in the upper surface of poly layer 44, as shown in FIG. 5L. An oxide etch is then used to remove oxide spacers 96. This oxide etch also removes some of the oxide 94 in the isolation regions 24. A thermal oxidation is then performed to form an oxide layer 98 over poly layer 44, which is then followed by a dry oxide etch that removes oxide layer 98 except for over steeply sloped portions 44a, as illustrated in FIG. 5M. An anisotropic poly etch is then used to remove upper exposed portions of poly layer 44, including those portions of poly layer 44 disposed over substrate strip 10a separating adjacent pairs of third trenches 40, but not those portions directly underneath oxide layer 98, as illustrated in FIG. 5N. This poly etch leaves separate poly blocks 50, each disposed in one of the third trenches 40. Each poly block 50 includes a narrow upper portion 50a that extends up and out of one of the third trenches 40 (and above the surface of substrate 10). Each upper portion 50a terminates in an upwardly pointing sharp edge 100 (directly underneath oxide layer 98).

Oxide blocks 102 are then formed in second trenches 30 via oxide deposition and etch (e.g. CMP oxide etch followed by controlled oxide etch), so that oxide blocks 102 are recessed below nitride 30. Oxide spacers 104 are then formed along the sidewalls of second trenches 32 and over oxide 102 via oxide deposition and anisotropic oxide etch (which removes some of oxide 102). Further oxide etching is performed, if necessary, to ensure that sharp edges 100 of poly upper portion 50a extend above the upper surface of oxide 102, as illustrated in FIG. 5O. A thin oxide layer 106 is deposited over the structure, covering nitride 30, oxide 102, oxide spacers 104 and sharp edges 100 of poly portions 50a. A poly deposition and etch back process follows to form poly blocks 108 in second trenches 32 and over oxide layer 106. Poly blocks 108 preferably are recessed below the tops of nitride 30. An oxide deposition and etch back process is then used to form oxide blocks 110 in second trenches 32 and over poly blocks 108 (which also removes portions of oxide layer 106 over nitride 30). The resulting structure is shown in FIG. 5P.

A nitride etch (e.g. wet nitride etch) follows, which removes nitride layer 30. An oxide layer 112 is then formed along the exposed portions of substrate 10 and poly blocks 50, preferably through thermal oxidation, as illustrated in FIG. 5Q. Alternately, oxide layer could be formed over the entire structure via oxide deposition. Additionally, the formation and anisotropic etch of a sacrificial oxide (not shown) could be performed to help insulate the side portions of poly blocks 108.

The processing steps described above with respect to FIGS. 2O and 2P are performed on the structure of FIG. 5Q, resulting in the final memory cell structure shown in FIG. 5R. In this final memory structure, poly blocks 108 serve as erase gates (which are continuously formed as erase lines that extend across the active and isolation regions in the same manner as are the control gates/lines), and the sharp edges 100 of the floating gates 50 are facing the erase gates 108 and not the control gate 62. By having the erase gates 108 spaced apart and insulated from the control gates 62, the erase gates 108 can be optimized for Fowler-Nordheim tunneling with the floating gates 52 (through oxide layer 106 during the erase operation) separately from the optimization of the control gates 62 for controlling channel region portions 88 (during the read and program operations). Moreover, since the erase gates 108 can be separately controlled relative to the control gates 62, the functions of erase and read/program can be separated, thereby creating a greater degree of control over the program and read operations than over the erase operations. In this embodiment, the erase gates 108 (like the control gates 62) extend across the active and isolation regions (so that an entire row of memory cell pairs are erased when a selected erase gate 108 is brought up to an erase potential).

During erase, the control gates 62 and source regions 54 are all held to zero volts. The erase gate 108 is raised to a high voltage such as 5~12V. Floating gates 50 couple strongly to the various nodes at zero volts and thereby have a low potential. A high field exists between the erase gate 108 and the floating gates 50 thus enabling Fowler-Nordheim tunneling. During programming, the control gates 62 of bits to be programmed are held at a voltage above the threshold of the channel. A typical voltage for this purpose is in the range of 0.6 to 2.5 volts. Bit-line contacts 74 of cells to be programmed are held at a potential lower than the control gates 62. A typical voltage is 0~1.0V. Erase gates 108 may be held at an intermediate voltage such as 0 to 5V for the purpose of facilitating programming by coupling the floating gates 50 to a more positive voltage. Source regions 54 of cells to be programmed are ramped to a high voltage between 3.0 and 8.0V. Programming proceeds by hot-electron injection. In addition to the advantages listed above, an additional advantage of this embodiment is that the additional positive voltage coupled onto the floating gates further favors the generation and collection of hot electrons.

SECOND ALTERNATE EMBODIMENT

Figure 6:
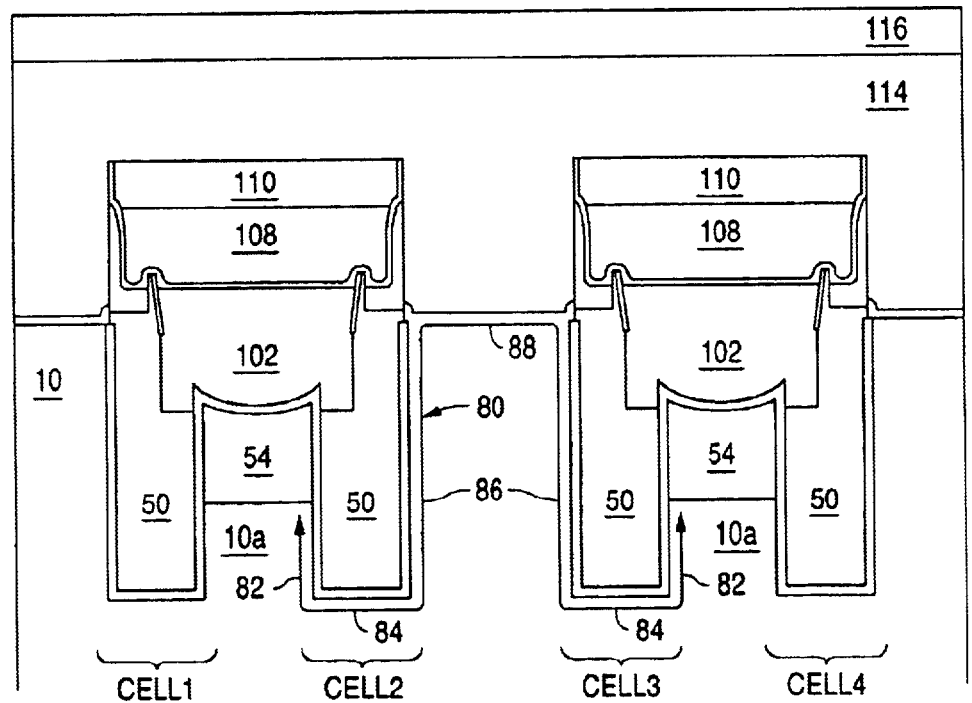
FIG. 6 is a cross-section view of the non-volatile memory cells according to a second alternate embodiment of the present invention.

FIG. 6 illustrates a second alternate embodiment of the present invention, which omits the formation of drain regions 68 and the metal contacts thereto, and employs bi-direction operation to read and program the memory cells. The structure of FIG. 6 is formed by starting with the structure of FIG. 5Q. Instead of forming control gates 62 and drain regions 68, a thick poly layer 114 is formed over each active region (e.g. by poly deposition followed by a lithographic poly etch for removing poly layer 114 from the isolation regions 24), resulting in a strip of poly layer 114 extending along the length of each active region 22. An optional polycide layer 116 can be formed over the poly layer 114 via metal deposition and anneal, to enhance conduction along the length of poly layer 114, resulting in the structure shown in FIG. 6. Each strip of poly layer 114 has lower portions thereof that are disposed over and insulated from the channel region portions 88, acting as control gates therefore that are all integrally formed together for the entire active region.

While the memory cells of FIG. 6 are erased in the same manner as those of FIG. 5R (i.e. raising the erase gate to a high potential to induce Fowler-Nordheim tunneling), each memory cell is programmed and read using the source region 56 from an adjacent cell.

For example, there are four memory cells illustrated in FIG. 6: CELL1, CELL2, CELL3, and CELL4. To program CELL 2, a ground potential is applied to the source region 54 for CELL3/CELL4. A voltage of about 3–5 volts is applied to the erase gate 108 for CELL3/CELL4, which couples to the adjacent floating gate 50 (for CELL3) thus turning on channel region portions 82/84/86 adjacent thereto. A positive voltage (e.g. around 2 volts) is applied to control gate 114, thus turning on channel region portion 88 (between CELL2 and CELL3). A positive high voltage (e.g. on the order of 5 to 12 volts) is applied to CELL2's source region 54. Electrons generated by the source region 54 of CELL3/CELL4 will flow therefrom towards the positive voltage source region 54 (of CELL2) through the deeply depleted channel portions 82/84/86/88. As the electrons reach the vertical channel region portion 86 for CELL2, they will see the high potential of floating gate 50 of CELL2 (which is strongly voltage-coupled to the positively charged source region 54 of CELL2). The electrons will accelerate and become heated, with most of them being injected into and through the insulating layer 42 and onto the floating gate 50 (for CELL2). Low or ground potential is applied to the source regions 54 and control gates 114 for memory cell rows/columns not containing the selected memory cell. Thus, only CELL2 in the selected row and column is programmed.

To read CELL 2, ground potential is applied to its source region 54. A read voltage (e.g. −0.5 to 2 volts) is applied to source region 54 of CELL3/CELL4, and approximately 1 to 4 volts (depending upon the power supply voltage of the device) is applied to control gate 114. A voltage of 3–5 volts is applied to erase gate 108 for CELL3/CELL4 (which couples to the adjacent floating gate 50 (for CELL3) thus turning on channel region portions 82/84/86 adjacent thereto). If the floating gate 50 for CELL2 is positively charged (i.e. the floating gate is discharged of electrons), then the channel region portions 82/84/86 (directly adjacent thereto) are turned on. When the control gate 114 is raised to the read potential, the horizontal channel region portion 88 is also turned on. Thus, the entire channel region 80 will be turned on, causing electrons to flow from the source region 54 for CELL2 to the source region for CELL3/CELL4. This sensed electrical current would be the "1" state.

On the other hand, if the floating gate 50 for CELL2 is negatively charged, the channel region portions 82/84/86 adjacent thereto are either weakly turned on or is entirely shut off, allowing little or no current to flow there-through which is sensed as a "0" state. Ground potential is applied to the source regions 54 and control gates 114 for non-selected columns and rows so only the selected memory cell is read.

With this embodiment, formation of drain regions and the metal contacts to those drain regions is avoided, simplifying the process flow and reducing the size of the memory array.

THIRD ALTERNATE EMBODIMENT

Figure 7A:
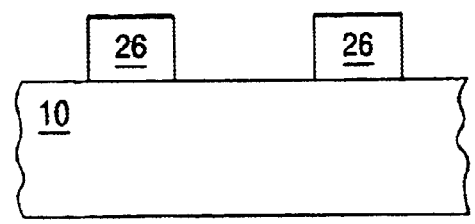
FIG. 7A is a cross sectional view showing the formation of the isolation regions for a third alternate embodiment of the present invention.
Figure 7B:
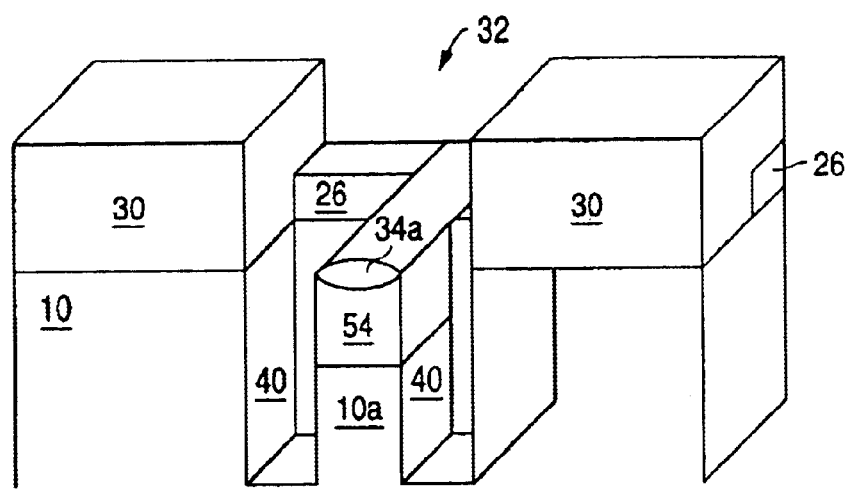
FIG. 7B is a cross sectional view showing the formation of the third trenches according to the third alternate embodiment of the present invention.

FIGS. 7A and 7B illustrate a third alternate embodiment of the present invention, where the STI oxide in the isolation regions is formed above the substrate surface so that it can provide isolation above the substrate surface and between the drain region contacts 74.

The processing steps for this embodiment are the same as those for the first alternate embodiment (FIGS. 4 and 5A–5R), except for the following exceptions. First, the STI blocks 26 of FIG. 1F are formed on the surface of the substrate 10, as illustrated in FIG. 7A, and do not extend into substrate 10. This is accomplished by omitting the silicon etch of FIG. 1D. The silicon etch of FIG. 5B is also omitted, so that second trenches 32 do not extend below the substrate surface. After the spacers 36 of FIG. 5E are formed, masking material is formed over nitride blocks 30 and partially over nitride spacers 36, leaving just the center of second trenches 32 exposed. An oxide etch is then used to remove the center portions of STI blocks (left exposed the second trenches between spacers 36. Thus, when third trenches 40 of FIG. 5G are formed in the active region, the silicon etch is blocked by presence of STI blocks in the isolation regions of second trenches 32, and third trenches 40 are formed only in the active regions, as shown in FIG. 7B. Lastly, the sacrificial oxide 92 and oxide 94 of FIGS. 5H and 5I is omitted.

With this embodiment, adjacent drain region contacts are separated by insulation material (i.e. STI blocks 26) for better isolation therebetween. Further, the isolation between the floating gates 50 is self aligned to the isolation between the drain region contacts 74.

FOURTH ALTERNATE EMBODIMENT

Figure 8:
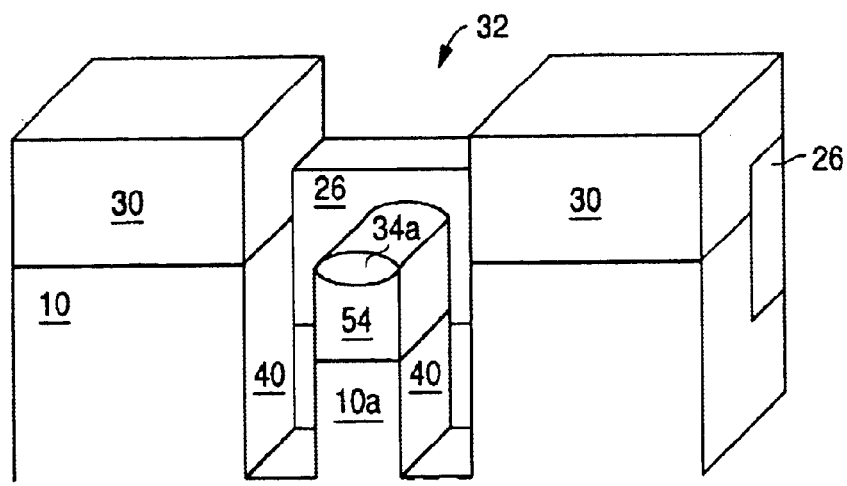
FIG. 8 is a cross sectional view showing the formation of the third trenches according to a fourth alternate embodiment of the present invention.

FIG. 8 illustrates a fourth alternate embodiment of the present invention, where the STI oxide in the isolation regions is formed both above and below the substrate surface.

The processing steps for this embodiment are the same as those for the first alternate embodiment (FIGS. 4 and 5A–5R), except for the following exceptions. First, the STI blocks 26 are formed as shown in FIG. 1F, where the STI blocks 26 are buried below the substrate surface, and extend up above the substrate surface. The silicon and oxide etches of FIG. 5B are omitted, so that second trenches 32 do not extend below the substrate surface, and STI blocks 26 are not removed from the isolation region portions of second trenches 32. Thus, when third trenches 40 are formed with the silicon etch of FIG. 5G, third trenches are not formed in the isolation regions, as illustrated in FIG. 8. The sacrificial oxide 92 and oxide 94 of FIGS. 5H and 5I is omitted, meaning that oxide 34a is not removed. After the oxide layer 42 of FIG. 5K is formed, the structure is annealed, so that source regions 54 are diffused deeper into substrate strip 10a, and under STI blocks 26, so that the source regions 54 merge together underneath STI blocks 26, forming conductive source lines that extend across the active and isolation regions 22/24. With regard to the formation of poly layer 44 of FIG. 5K, its top surface should be even with or below the top surface of STI blocks 26, (i.e. so poly layer 44 is fully removed from the isolation regions 24). With the completed structure, STI blocks 26 provide isolation between adjacent drain region contacts 74.

With the present embodiment, the floating gate isolation (from adjacent floating gates across isolation regions 24) is self aligned with the drain region contact isolation. Diffusing the source regions deeper into the substrate to merge them together also results in extending the source regions 54 further down along floating gates 50 for better voltage coupling therebetween.

It is to be understood that the present invention is not limited to the embodiment(s) described above and illustrated herein, but encompasses any and all variations falling within the scope of the appended claims. For example, trenches 20/32/40 can end up having any shape that extends into the substrate, not just the elongated rectangular shape shown in the figures. Also, although the foregoing method describes the use of appropriately doped polysilicon as the conductive material used to form the memory cells, it should be clear to those having ordinary skill in the art that in the context of this disclosure and the appended claims, "polysilicon" refers to any appropriate conductive material that can be used to form the elements of non-volatile memory cells. In addition, any appropriate insulator can be used in place of silicon dioxide or silicon nitride. Moreover, any appropriate material who's etch property differs from that of silicon dioxide (or any insulator) and from polysilicon (or any conductor) can be used in place of silicon nitride. Further, as is apparent from the claims, not all method steps need be performed in the exact order illustrated or claimed, but rather in any order that allows the proper formation of the memory cell of the present invention. Additionally, the above described invention is shown to be formed in a substrate which is shown to be uniformly doped, but it is well known and contemplated by the present invention that memory cell elements can be formed in well regions of the substrate, which are regions that are doped to have a different conductivity type compared to other portions of the substrate. It is possible to extend source region 54 down to or even beyond the bottom of substrate strip portion 10a, thus eliminating portion 82 from each of the channel regions 80. Lastly, single layers of insulating or conductive material could be formed as multiple layers of such materials, and vice versa.

What is claimed is:

1. An electrically programmable and erasable memory device, comprising:
    a substrate of semiconductor material having a first conductivity type and a surface;
    a pair of trenches formed into the substrate surface, wherein a strip of the substrate is disposed between the pair of trenches;
    a first region of a second conductivity type formed in the substrate strip;
    a pair of second regions of the second conductivity type formed in the substrate and spaced apart from the first region;
    a pair of channel regions each extending from the first region to one of the second regions and each having a first portion extending underneath one of the trenches, a second portion not disposed in the substrate strip and extending along the one trench, and a third portion extending along the substrate surface;
    a pair of electrically conductive floating gates each having at least a lower portion thereof disposed in one of the trenches; and
    a pair of electrically conductive control gates each disposed over and insulated from one of the channel region third portions.

2. The device of claim 1, wherein each of the floating gates is disposed adjacent to and insulated from the first and second portions of one of the channel regions for controlling a conductivity thereof.

3. The device of claim 1, wherein each of the channel regions includes a fourth portion disposed in the substrate strip and extending along one of the trenches.

4. The device of claim 3, wherein each of the floating gates is disposed adjacent to and insulated from the first, second and fourth portions of one of the channel regions for controlling a conductivity thereof.

5. The device of claim 3, wherein the channel region first and third portions are generally parallel to the substrate surface, and the channel region second and fourth portions are generally perpendicular to the substrate surface.

6. The device of claim 3, wherein the floating gates extend deeper into the substrate than does the first region.

7. The device of claim 3, wherein:
each of the trenches includes opposing first and second sidewalls and a bottom wall;
the first region is disposed between the first sidewalls of the pair of trenches;
each of the channel region fourth portions is disposed along one of the first sidewalls;
each of the channel region first portions is disposed along one of the bottom walls; and
each of the channel region second portions is disposed along one of the second sidewalls.

8. The device of claim 3, further comprising:
a second pair of trenches formed into the substrate surface, wherein a second strip of the substrate is disposed between the second pair of trenches, and wherein one of the second regions is formed in the second substrate strip;
one of the channel regions includes a fifth portion not disposed in the second substrate strip and extending along one of the second pair of trenches, a sixth portion extending underneath one of the second pair of trenches, and a seventh portion disposed in the second substrate strip and extending along one of the second pair of trenches; and
a second pair of electrically conductive floating gates each having at least a lower portion thereof disposed in one of the second pair of trenches.

9. The device of claim 1, wherein:
each of the trenches includes opposing first and second sidewalls and a bottom wall;
the first region is disposed between the first sidewalls of the pair of trenches;
each of the channel region first portions is disposed along one of the bottom walls; and
each of the channel region second portions is disposed along one of the second sidewalls.

10. The device of claim 1, wherein each of the floating gates has an edge that faces one of the control gates and is insulated therefrom with insulation material having a thickness that permits tunneling of charges from the edge to the one control gate.

11. The device of claim 1, wherein the first region is disposed laterally adjacent to and insulated from the floating gates.

12. The device of claim 1, further comprising:
an electrically conductive erase gate that is insulated from the floating gates and the control gates, wherein each of the floating gates has an edge that faces the erase gate and is insulated therefrom with insulation material having a thickness that permits tunneling of charges from the edge to the erase gate.

13. The device of claim 1, further comprising:
a second pair of trenches formed into the substrate surface, wherein a second strip of the substrate is disposed between the second pair of trenches, and wherein one of the second regions is formed in the second substrate strip;
one of the channel regions includes a fourth portion not disposed in the second substrate strip and extending along one of the second pair of trenches, and a fifth portion extending underneath one of the second pair of trenches; and a second pair of electrically conductive floating gates each having at least a lower portion thereof disposed in one of the second pair of trenches.

14. The device of claim 13, wherein the control gates are integrally formed together from continuously formed conductive material.

15. An array of electrically programmable and erasable memory devices, comprising:
a substrate of semiconductor material having a first conductivity type and a surface;
spaced apart isolation regions of the substrate which are substantially parallel to one another and extend in a first direction, with an active region between each pair of adjacent isolation regions; and
each of the active regions including a plurality of pairs of memory cells, wherein each of the memory cell pairs comprises:
a pair of trenches formed into the substrate surface, wherein a strip of the substrate is disposed between the pair of trenches,
a first region of a second conductivity type formed in the substrate strip,
a pair of second regions of the second conductivity type formed in the substrate and spaced apart from the first region,
a pair of channel regions each extending from the first region to one of the second regions and each having a first portion extending underneath one of the trenches, a second portion not disposed in the substrate strip and extending along the one trench, and a third portion extending along the substrate surface,
a pair of electrically conductive floating gates each having at least a lower portion thereof disposed in one of the trenches, and
a pair of electrically conductive control gates each disposed over and insulated from one of the channel region third portions.

16. The array of claim 15, wherein each of the floating gates is disposed adjacent to and insulated from the first and second portions of one of the channel regions for controlling a conductivity thereof.

17. The array of claim 15, wherein each of the channel regions includes a fourth portion disposed in one of the substrate strips and extending along one of the trenches.

18. The array of claim 17, wherein each of the floating gates is disposed adjacent to and insulated from the first, second and fourth portions of one of the channel regions for controlling a conductivity thereof.

19. The array of claim 17, wherein the channel region first and third portions are generally parallel to the substrate surface, and the channel region second and fourth portions are generally perpendicular to the substrate surface.

20. The array of claim 17, wherein the floating gates extend deeper into the substrate than do the first regions.

21. The array of claim 17, wherein:
each of the trenches includes opposing first and second sidewalls and a bottom wall;
each of the first regions is disposed between the first sidewalls of one of the trench pairs;
each of the channel region fourth portions is disposed along one of the first sidewalls;
each of the channel region first portions is disposed along one of the bottom walls; and
each of the channel region second portions is disposed along one of the second sidewalls.

22. The array of claim 15, wherein:
each of the trenches includes opposing first and second sidewalls and a bottom wall;
each of the first regions is disposed between the first sidewalls of one of the trench pairs;
each of the channel region first portions is disposed along one of the bottom walls; and
each of the channel region second portions is disposed along one of the second sidewalls.

23. The array of claim 15, wherein each of the floating gates has an edge that faces one of the control gates and is insulated therefrom with insulation material having a thickness that permits tunneling of charges from the edge to the one control gate.

24. The array of claim 15, wherein each of the first regions is disposed laterally adjacent to and insulated from one of the floating gate pairs.

25. The array of claim 15, further comprising:
a plurality of conductive control lines of conductive material each extending across the active and isolation regions in a second direction perpendicular to the first direction and each electrically connecting together one of the control gates from each of the active regions.

26. The array of claim 15, further comprising:
a plurality of conductive source lines of conductive material each extending across the active and isolation regions in a second direction perpendicular to the first direction and each electrically connecting together one of the first regions from each of the active regions.

27. The array of claim 15, wherein each of the memory cell pairs further comprises:
an electrically conductive erase gate that is insulated from the pair of floating gates and the pair of control gates, wherein each of the floating gates has an edge that faces the erase gate and is insulated therefrom with insulation material having a thickness that permits tunneling of charges from the edge to the erase gate.

28. The array of claim 27, further comprising:
a plurality of conductive erase lines of conductive material each extending across the active and isolation regions in a second direction perpendicular to the first direction and each electrically connecting together one of the erase gates from each of the active regions.

29. An array of electrically programmable and erasable memory devices, comprising:
a substrate of semiconductor material having a first conductivity type and a surface;
spaced apart isolation regions of the substrate which are substantially parallel to one another and extend in a first direction, with an active region between each pair of adjacent isolation regions; and
each of the active regions including a plurality of pairs of memory cells, wherein each one of the memory cell pairs comprises:
a pair of trenches formed into the substrate surface, wherein a strip of the substrate is disposed between the pair of trenches,
a first region of a second conductivity type formed in the substrate strip,
a pair of channel regions each extending from the first region of the one pair of memory cells to first regions of adjacent pairs of memory cells, wherein each of the channel regions includes a first portion extending underneath one of the trenches, a second portion not disposed in the substrate strip and extending along the one trench, a third portion extending along the substrate surface, a fourth portion extending along one of the trenches for one of the adjacent pairs of memory cells and a fifth portion extending underneath the one trench from the one adjacent pair of memory cells,
a pair of electrically conductive floating gates each having at least a lower portion thereof disposed in one of the trenches, and
a pair of electrically conductive control gates each disposed over and insulated from one of the channel region third portions.

30. The array of claim 29, wherein for each of the active regions, the control gates therein are integrally formed together from continuously formed conductive material.

31. The array of claim 29, wherein each of the channel regions further includes:
a sixth portion disposed in the substrate strip for the one memory cell pair and extending along one of the trenches for the one memory cell pair; and
a seventh portion disposed in the substrate strip for the one adjacent pair of memory cells and extending along one of the trenches for the one adjacent pair of memory cells.

32. An electrically programmable and erasable memory device, comprising:
a substrate of semiconductor material having a first conductivity type and a surface;
a first trench formed into the substrate surface;
a second trench formed into the substrate surface that is spaced apart from the first trench by a portion of the substrate;
a first region of a second conductivity type formed in the substrate adjacent the first trench and not in the substrate portion;
a second region of the second conductivity type formed in the substrate adjacent the second trench and not in the substrate portion;
a channel region of the substrate extending between the first and second regions, wherein the channel region includes a first portion extending from the first region and along the first trench, a second portion extending underneath the first trench, a third portion disposed in the substrate portion and extending along the first trench, a fourth portion disposed in the substrate portion and extending along the substrate surface, a fifth portion disposed in the substrate portion and extending along the second trench, a sixth portion extending underneath the second trench, and a seventh portion extending from the second region and along the second trench;
a pair of electrically conductive floating gates each having at least a lower portion thereof disposed in one of the first and second trenches; and
an electrically conductive control gate disposed over and insulated from the channel region fourth portion.

33. The device of claim 32, wherein:
the first floating gate is disposed adjacent to and insulated from the first, second and third portions of the channel region for controlling a conductivity thereof; and
the second floating gate is disposed adjacent to and insulated from the fifth, sixth and seventh portions of the channel region for controlling a conductivity thereof.

34. The device of claim 32, wherein the channel region first, third, fifth and seventh portions are generally perpendicular to the substrate surface, and the channel region second, fourth and sixth portions are generally parallel to the substrate surface.

35. The device of claim 32, wherein the floating gates extend deeper into the substrate than do the first and second regions.

36. The device of claim 32, further comprising:
a pair of conductive erase gates that are insulated from the floating gates and the control gate, wherein each of the floating gates has an edge that faces one of the erase gates and is insulated therefrom with insulation material having a thickness that permits tunneling of charges from the edge to the erase gate.

* * * * *